(12) United States Patent
Issa

(10) Patent No.: US 10,884,829 B1
(45) Date of Patent: Jan. 5, 2021

(54) SHARED BUFFER MEMORY ARCHITECTURE

(71) Applicant: Innovium, Inc., San Jose, CA (US)

(72) Inventor: Mohammad Kamel Issa, Los Altos, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 16/867,490

(22) Filed: May 5, 2020

(51) Int. Cl.
| | |
|---|---|
| G06F 3/00 | (2006.01) |
| G06F 9/54 | (2006.01) |
| G06F 9/52 | (2006.01) |
| G11C 7/22 | (2006.01) |
| G06F 9/30 | (2018.01) |
| G11C 7/10 | (2006.01) |
| G06F 9/48 | (2006.01) |

(52) U.S. Cl.
CPC .......... *G06F 9/544* (2013.01); *G06F 9/30029* (2013.01); *G06F 9/4881* (2013.01); *G06F 9/52* (2013.01); *G11C 7/1015* (2013.01); *G11C 7/222* (2013.01)

(58) Field of Classification Search
CPC ................................................ G06F 9/544
See application file for complete search history.

(56) References Cited

U.S. PATENT DOCUMENTS

| | | | | | |
|---|---|---|---|---|---|
| 4,882,683 A | * | 11/1989 | Rupp | .............. | G09G 5/393 345/568 |
| 6,086,631 A | * | 7/2000 | Chaudhary | .......... | G06F 30/392 716/116 |
| 6,301,299 B1 | * | 10/2001 | Sita | .......... | G09G 5/39 348/714 |
| 8,868,484 B2 | * | 10/2014 | Aggarwal | .......... | G06F 16/2379 707/602 |
| 2006/0013315 A1 | * | 1/2006 | Song | ......... | H04N 19/44 375/240.24 |
| 2014/0285505 A1 | * | 9/2014 | Nakanishi | ......... | G06T 1/20 345/545 |

OTHER PUBLICATIONS

James Jeng-Weei Lin, Effects of Field of View on Presence, Enjoyment, Memory, and Simulator Sickness in a Virtual Environment. (Year: 2002).*

* cited by examiner

*Primary Examiner* — Lechi Truong
(74) *Attorney, Agent, or Firm* — Wong & Rees LLP; Karl T. Rees

(57) ABSTRACT

An improved buffer for networking devices and other computing devices comprises multiple memory instances, each having a distinct set of entries. Transport data units ("TDUs") are divided into storage data units ("SDUs"), and each SDU is stored within a separate entry of a separate memory instance in a logical bank. A grid of the memory instances is organized into overlapping horizontal logical banks and vertical logical banks. A memory instance may be shared between horizontal and vertical logical banks. When overlapping logical banks are accessed concurrently, the memory instance that they share may be inaccessible to one of the logical banks. Accordingly, when writing a TDU, a parity SDU may be generated for the TDU and also stored within its logical bank. The TDU's content within the shared memory instance may then be reconstructed from the parity SDU without having to read the shared memory instance.

20 Claims, 18 Drawing Sheets

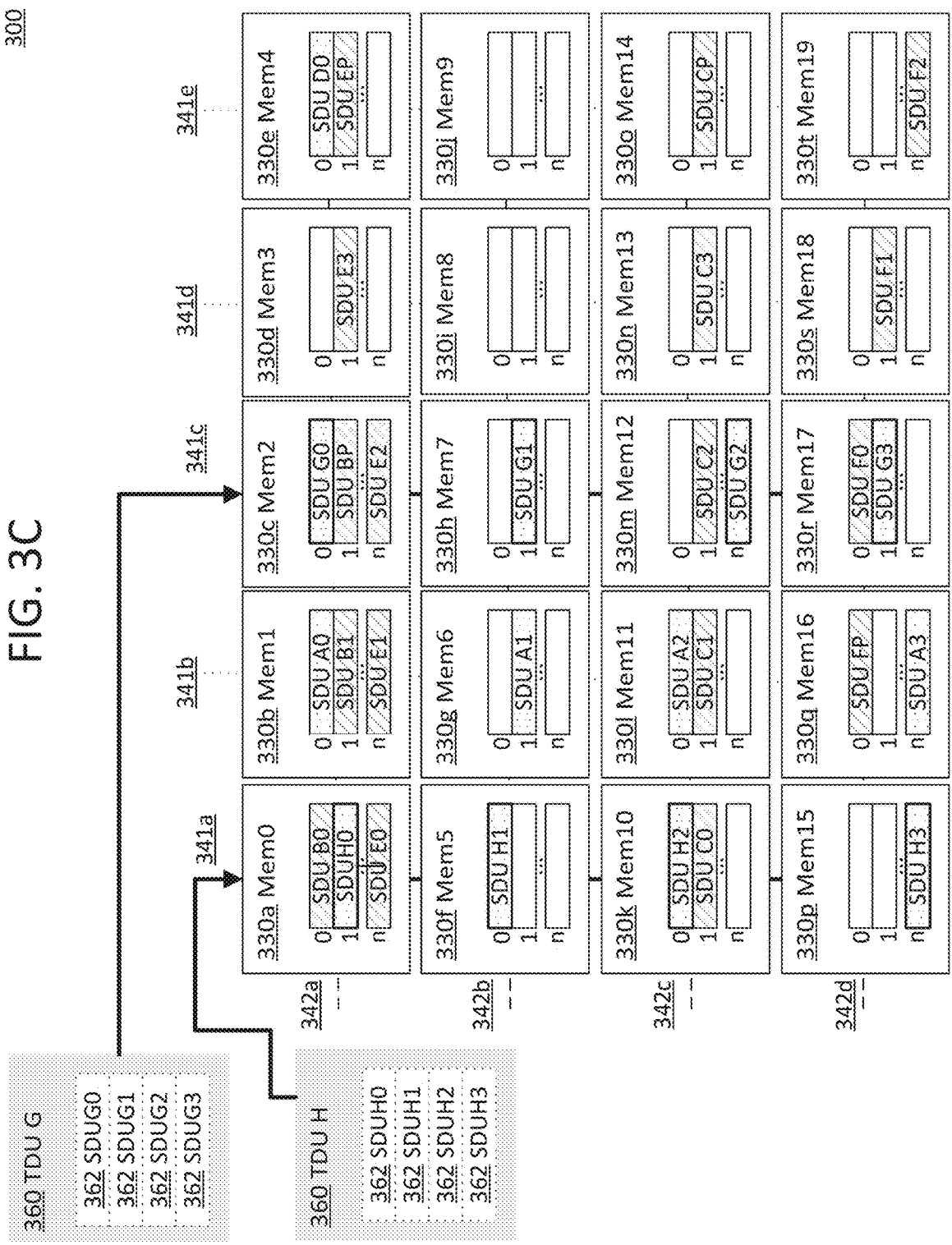

SHARED BUFFER MEMORY ARCHITECTURE

TECHNICAL FIELD

Embodiments relate generally to data buffering, and, more specifically, to buffering data units within a network device.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

The process of temporarily storing data while the data awaits processing is commonly known as "buffering." In computing devices, including both networking apparatuses and other devices, various components may need to temporarily store data while the data awaits processing. For example, a network switch may receive, from time to time, more data in a given period of time than can be processed by its packet processors. A traffic manager or other component within the switch may therefore regulate the flow of this data to the packet processors by buffering the data until the packet processors are ready to process the data.

Data temporarily stored in this manner is said to be stored in a buffer. A buffer may comprise one or more memory instances in which data may be stored. A memory instance is an independently addressable and accessible unit of memory, such as an on-chip block of memory (e.g. an array of memory cells) or off-chip memory chip. In an embodiment, static random-access memories ("SRAM") may be preferred for speed and/or cost. However, in other embodiments any suitable type of memory may be utilized for a memory instance, including dynamic random-access memories, registers, flash-based memories, and so forth.

A memory instance may be classified based upon its access limitations, in terms of the number of operations that may be performed with respect to the memory instance in a given memory access period, such as a memory clock cycle. For instance, a memory instance may be single-ported, in that only one operation is supported in a time slot (either a read operation or a write operation). Or, a memory instance may be multi-ported, in that two, three, or even more operations are supported in a memory clock cycle. In some embodiments, single-ported memories are preferred for cost efficiency, power demands, and/or other reasons. However, in other embodiments, dual-ported or other multi-ported memories may be preferred.

Each memory operation reads from or writes to a specified address in the memory instance. Each address corresponds to a different location within the memory, also referred to as an entry or buffer entry. Each entry is of a fixed size (e.g. a fixed number of bits or bytes), and this size is also known as the "width" of the memory instance. The number of entries within the memory instance is known as the "depth" of the memory instance.

It is generally desirable to optimize the components of a computing device, including the buffers, so that the device quickly determines where to send and/or store data for processing, and to expediently send and/or store that data to the appropriate destination once determined.

BRIEF DESCRIPTION OF THE DRAWINGS

The present inventive subject matter is illustrated by way of example, and not by way of limitation, in the figures of the accompanying drawings and in which like reference numerals refer to similar elements and in which:

FIGS. 3A-3E illustrates the concurrent use of horizontal and vertical logical banks that share memory instances, with respect to example data;

FIG. 12 illustrates different levels of data units that a network node may act upon or with respect to;

DETAILED DESCRIPTION

Figure 1:
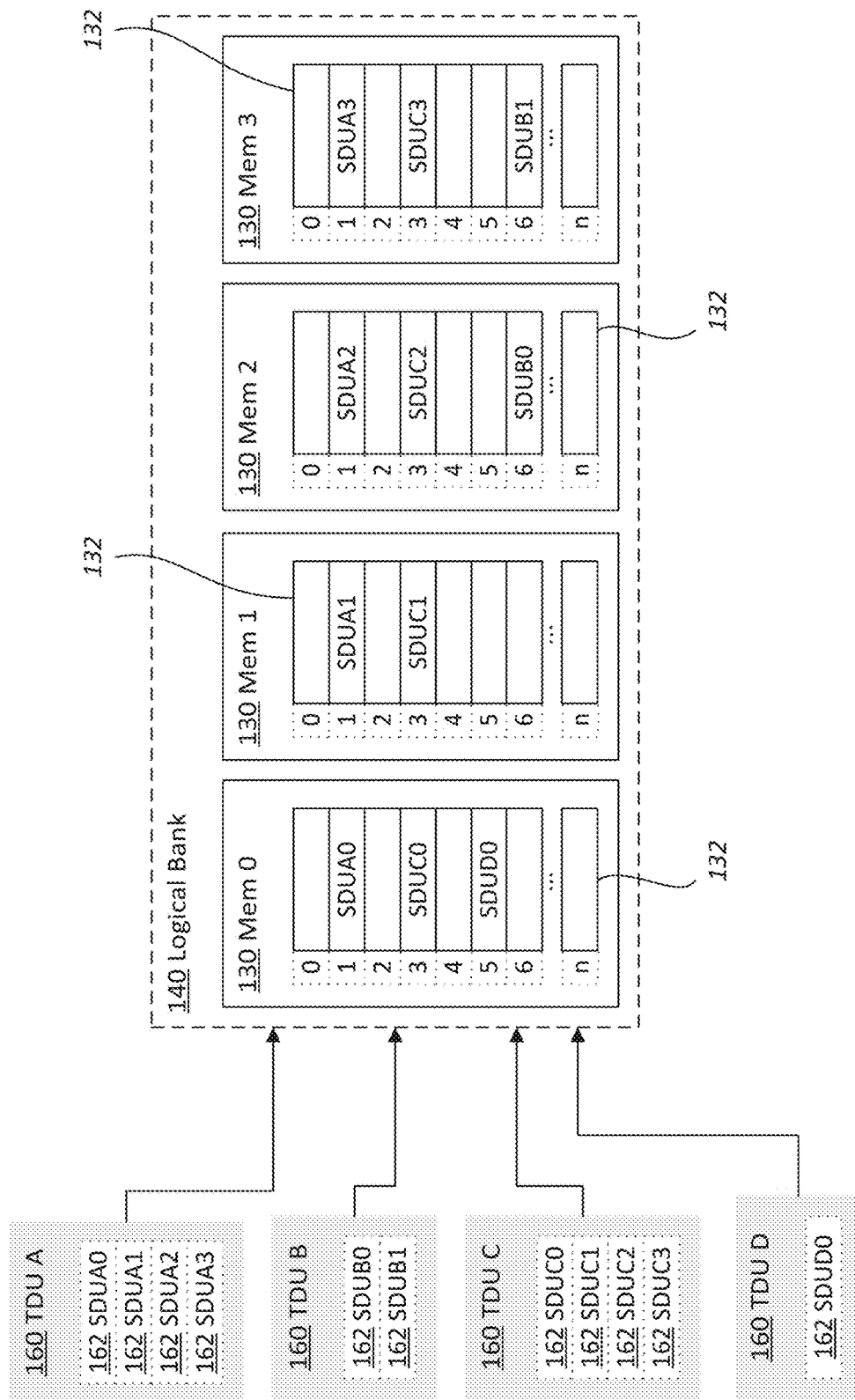
FIG. 1 illustrates an example logical bank comprising four independent memory instances, according to an embodiment.

In the following description, for the purposes of explanation, numerous specific details are set forth in order to provide a thorough understanding of the present inventive subject matter. It will be apparent, however, that the present inventive subject matter may be practiced without these specific details. In other instances, well-known structures and devices are shown in block diagram form in order to avoid unnecessarily obscuring the present inventive subject matter.

Embodiments are described herein according to the following outline:

1.0. General Overview
2.0. Structural Overview
2.1. Logical Banks of Memory Instances
2.2. Buffer Management
2.3. Shared Memory Instances and Parity Data
2.4. Horizontal and Vertical Logical Banks
2.5. Diagonal Logical Banks
2.6. Multiple Grids
2.7. Multi-Port Embodiments
2.8. Non-Parity-Based Embodiments
3.0. Functional Overview
3.1. Writing a TDU
3.2. Reading a TDU
3.3. Scheduling Operations
4.0. Example Implementing System
4.1. Networks
4.2. Data Units 4.3. Network Paths
4.4. Network Device
4.5. Ports
4.6. Packet Processors
4.7. Buffers
4.8. Queues
4.9. Traffic Management
4.10. Forwarding Logic
4.11. Miscellaneous
5.0. Example Embodiments
6.0. Implementation Mechanism—Hardware Overview
7.0. Extensions and Alternatives 1.0. General Overview Approaches, techniques, and mechanisms are disclosed for improved buffering of data units within network devices and other computing devices. A buffer comprises multiple memory instances, each having a distinct set of entries. Data units referred to herein as transport data units ("TDUs") are divided into storage data units ("SDUs"), and each SDU is stored within a separate entry of these memory instances. A TDU is stored across a group of the memory instances, referred to as a logical bank, with each of its SDUs stored in a separate memory instance of the logical bank.

A grid of the memory instances is organized into overlapping horizontal logical banks and vertical logical banks. A memory instance may be shared between horizontal and vertical logical banks. When overlapping logical banks are accessed concurrently, the memory instance that they share may be inaccessible to one of the logical banks. Accordingly, when writing a TDU, a parity SDU may be generated for the TDU and also stored within its logical bank. The TDU's content within the shared memory instance may then be reconstructed from the parity SDU and the other SDUs of the TDU without having to read the shared memory instance.

According to an embodiment, different directions of logical banks may be associated with different attributes or functions of the data, thereby allowing sharing of buffer space between these attributes or functions. For instance, different directions may be associated with different sources or destinations of the data.

In an embodiment, there may be multiple grids of the memory instances within the buffer. In any given memory access period, each grid may be assigned to write operations in one of the directions, or to read operations. In an embodiment, the read operations may be all in the same direction, plus an additional read (or write) operation in the alternate direction. In yet other embodiments, a variety of arrangements of the operations are possible in each grid.

In an embodiment, there may be a third direction of logical banks within a grid, referred to as a diagonal logical bank. Hence, a memory instance may be shared by three different logical banks. Again, a parity SDU may be utilized to recover the data in the shared memory instance in the event one or even two of the logical banks that share the memory instance cannot access the memory instance in a given clock cycle.

In an embodiment, TDUs smaller than the full width of a logical bank may be read without reading all memory instances of the logical bank. Hence, multiple TDUs may be read from and/or written to a logical bank concurrently. Or, the fact that a memory instance belonging to a certain logical bank does not need to be accessed when the certain logical bank is being read in a certain clock cycle may permit an additional operation in a logical bank in a different direction that shares the memory instance.

In other aspects, the inventive subject matter encompasses computer apparatuses and/or computer-readable media configured to carry out the foregoing techniques.

2.0. Structural Overview

Structural aspects of enhanced buffering mechanisms are now described with respect to buffers comprised of multiple memory instances within a network device or other computing device. These additional memory instances may increase capacity and/or the amount of data that can be read in given memory access period. Each memory instance has its own access limitations independent of other memory instances. For instance, in a single-ported embodiment, each memory instance may be accessed no more than once during an access period (e.g. clock cycle). As another example, in a double-ported embodiment, each memory instance may be accessed no more than twice during an access period. In an embodiment, each memory instance has its own independent circuitry for reading and/or writing data.

As used herein, a memory access period is a fixed unit of time in which a fixed number of operations (e.g. one for single-ported memories) may be performed by each of the memory instances. The memory access period may, for example, be equal to a memory clock cycle, which may or may not be the same as the clock cycles of other hardware within the implementing device. In some embodiments, a memory access period may be longer or shorter than a single memory clock cycle.

Data typically enters and leaves the buffer as discrete units. The size of a unit entering or leaving the buffer depends on the context. For instance, in networking contexts, the size of the unit may be a frame or cell of a packet, though other sizes may be used instead. Throughout this application, the term "transport data unit" ("TDU") shall be used to refer to a discrete unit of data that is inputted into or outputted from a buffer. The techniques described herein are agnostic as to the structure of the data in the TDU, and should be understood as being applicable to the buffering of any type of data structure.

2.1. Logical Banks of Memory Instances

In an embodiment, rather than store an entire TDU in a single memory instance within the buffer, it may be beneficial to divide the TDU into smaller subunits, referred to herein as "storage data units" (SDUs), which are then stored in different memory instances. The width of such memory instances may be significantly smaller than they would need to be to store the entire TDU, and thus more cost efficient, simpler to implement, and/or faster than a memory instance large enough to hold the entire TDU. Each memory instance may be read concurrently, thereby allowing the entire TDU to still be read in a single access period. Moreover, depending on the embodiment, such an arrangement may result in less wasted buffer space, since TDUs smaller than the maximum TDU size would not necessarily consume the maximum TDU size within the buffer.

A group of memory instances that are utilized together to store TDUs in this manner are referred to herein as a logical memory bank, or simply a logical bank. FIG. 1 illustrates an example logical bank 140, comprising four independent memory instances 130, according to an embodiment. In other embodiments, there may be fewer or additional instances 130 per logical bank 140. Each memory instance 130 comprises a number of addressable slots, or entries, 132. Although eight entries 132 are depicted per memory instance 130, in other embodiments, there may be any number of entries 132 per instance 130. Each entry 132 is the same size. In other words, each memory instance 130 has a same width, which may vary depending on the embodiment.

Example TDUs 160 are illustrated as being stored in the logical bank 140. Each TDU 160 has been divided up into four SDUs 162. Each SDU 162 is of a size equal to or less than the width of the memory instances 130. In an embodiment, each SDU 162 except for the last SDU 162 in a TDU 160 may be of the same size, though this is not strictly necessary. The maximum size of a TDU 160 is the number of memory instances 130 in the logical bank 140 times the width of the memory instances 130. Thus, for example, each memory instance 130 might be 64 bits wide, and a TDU 160 may therefore be up to 256 bits in size.

Rather than storing each TDU 160 in a single memory instance 130, the SDUs 162 of a TDU 160 are divided up amongst the memory instances 130. For instance, the SDUs 162 labeled A0, A1, A2, and A3, which constitute the TDU 160 labeled TDU A, are stored in the memory instances 130 numbered 0, 1, 2, and 3, respectively. Each memory instance 130 stores no more than one SDU 162 from a given TDU 160, therefore allowing the entire TDU 160 to be read in a single memory access period.

To utilize the logical bank 140, buffer scheduling logic translates TDU read and write operations to the logical bank 140 into individual read and write operations for SDUs in the individual memory instances 130. For instance, a request to read TDU A from logical bank 140 would be translated to four separate requests to read the SDUs A0-A3 from their corresponding addresses in the memory instances 130.

As depicted, all of the SDUs 162 for a given TDU 160 are stored at the same address in their corresponding memory instances 130. Storing SDUs 162 in this manner may simplify the process of locating the constituent SDUs 162 of the given TDU 160 when the TDU 160 must be read, since only a single address need be stored for the TDU 160 (e.g. a "logical address" of the TDU). In other embodiments, however, the SDUs 162 for a given TDU 160 may instead be stored at different addresses in their respective memory instances 130, and a mapping mechanism (e.g. a mapping function, a TDU-to-SDU address map or list, etc.) may be used to determine the relevant addresses to read when it comes time to translate a request to read the TDU 160 into read requests to the individual memory instances 130.

On a similar note, as depicted, each TDU 160 blocks all entries at a specific address across all of the memory instances 130, even if not all of the entries are needed. For instance, the address 5 is depicted as being utilized to store only a single SDU D1 since the TDU 160 labeled TDU D had only a single SDU. Hence, while the entry 132 at address 5 of memory instance 0 is occupied by SDU D1, the entries 132 in the other memory instances are empty. In other embodiments, other TDUs, such as the TDU 160 labeled TDU B, may be stored at address 5 if they are small enough to fit in the unused entries. In this manner, the number of TDUs 160 that are stored in the logical bank 140 may be significantly increased.

2.2. Buffer Management

Buffers are typically coupled to buffer management logic that manages the use of the buffer. This management may include, among other aspects, determining where to store new data and when to perform input/output operations. The buffer management logic may, for instance, be hardware logic on a chip (e.g. in an ASIC or FPGA) comprising logic blocks configured to implement management techniques such as described herein. In another embodiment, the buffer management logic may be implemented at least partially by a processor executing software-based instructions.

Figure 2:
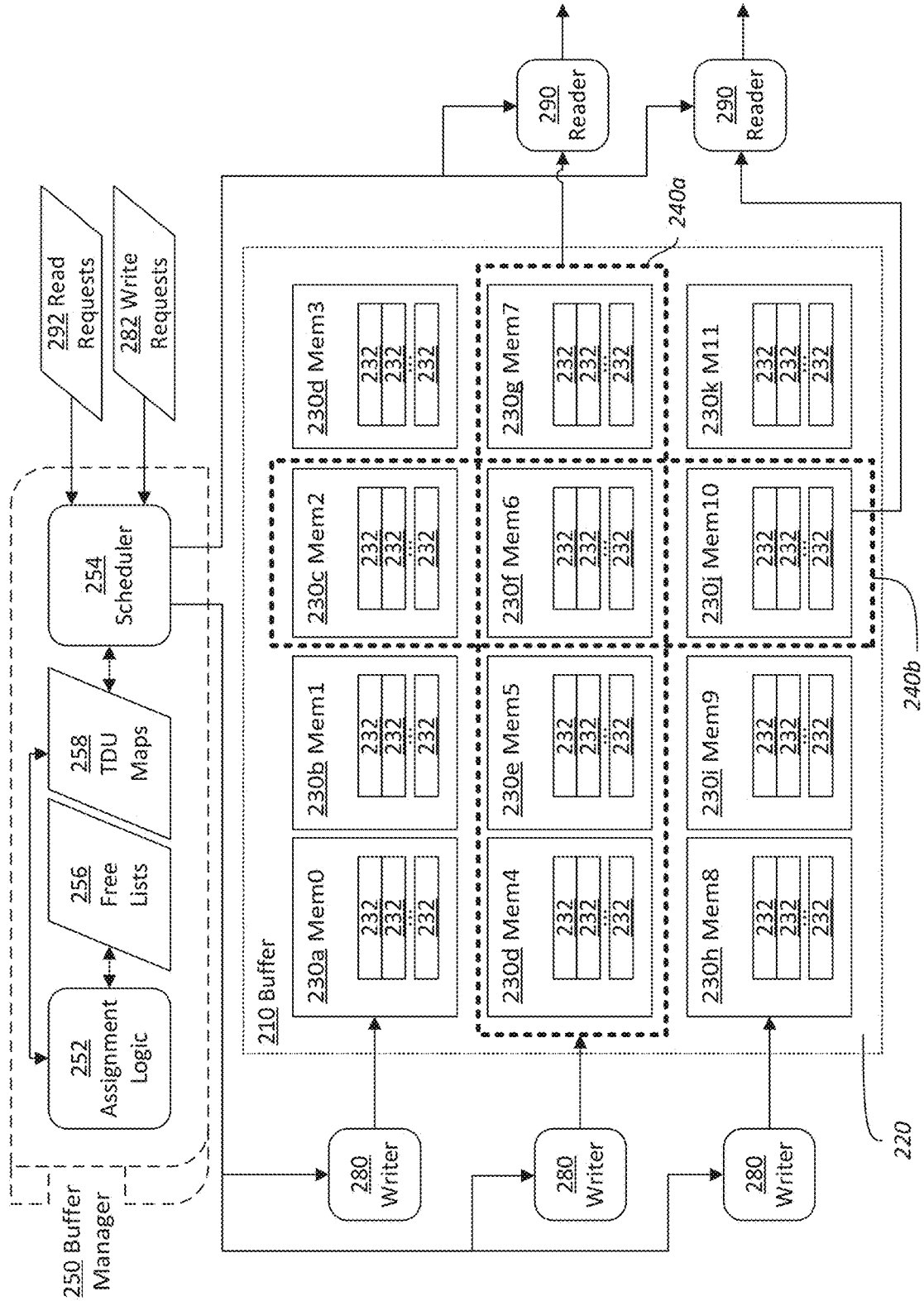
FIG. 2 depicts an example buffer management logic for managing an example buffer.

FIG. 2 depicts an example buffer management logic 250 for managing an example buffer 210, according to an embodiment. Buffer 210 includes a plurality of memory instances 230, similar to memory instances 130. These memory instances 230 are comprised of entries 232, which are similar to entries 132, in that they buffer individual SDUs for TDUs. The memory instances 230 are grouped into logical banks 240, with all of the data for a given TDU being stored within a same logical bank 240.

The buffer management logic 250 is configured to receive and service access requests, such as write requests 282 and read requests 292. Each write request 282 specifies a TDU to write to the buffer 210. Optionally, a write request 282 may include additional information, such as an associated source and/or destination, priority level, or other metadata that may affect how the buffer management logic 250 services the write request 282.

Buffer Assignment

Buffer assignment logic 252 determines a specific entry or entries 232 to which the TDU specified by a write request 282 is to be written. This determination may include, for instance, selecting a logical bank 240 to write the TDU to. The logical bank 240 may be selected using any suitable approach, depending on the embodiment. In some embodiments, the logical bank 240 may simply be selected at random, using a round-robin approach, and/or based on current fill levels (e.g. the least-filled logical bank), or using similar criteria.

In some embodiments, selection of the logical bank 240 may first involve filtering the available logical banks 240 to a set of candidate logical banks 240 based on various criteria. The logical bank 240 may then be selected from the candidate logical banks 240 using techniques such as the foregoing. For example, the logical bank 240 may be selected based on metadata associated with the write request 282. In an embodiment, for instance, a set of logical banks 240 may be associated with specific metadata found in the write request, such as a source or destination for the specified TDU, a traffic flow associated with the TDU, and so forth. The logical bank 240 may be randomly or otherwise selected from such a set.

As another example, the logical bank 240 may be selected based on availability after other access operations already scheduled for a current memory access period are considered. For instance, in some embodiments, logical banks 240 that are targeted for, or otherwise rendered inaccessible by, read operations in the current memory access period may be ineligible for write operations. In such an embodiment, the buffer assignment logic 252 may work in tandem with the scheduler 254 (to be discussed subsequently) to optimize selection of the logical bank 240 for a given TDU.

In an embodiment, the logical bank 240 may be selected based on free list information 256. The buffer management logic 250 may track one or more free lists 256 that indicate specific addresses that are available to store TDUs. The addresses may be tracked at a physical entry 232 level, and/or at a logical address level. In the latter case, logical banks 240 are said to have logical addresses in which TDUs are stored, and these logical addresses are mapped either directly or by some other mechanism to actual entries 232. If no logical address is available in a logical bank 240, then no entry 232 is considered to be available to store data within the logical bank 240. Regardless of how the free list is stored, if no entry 232 is available to store data in a logical bank 240, then the logical bank 240 is not selected for storing a new TDU.

In an embodiment, there may be a general free list 256 that spans logical banks 240, such that the next entry in the free list 256 indicates the next logical bank 240 to select. In an embodiment, the logical bank 240 may be selected by randomly selecting an entry from the free list 256, such that the probability of a logical bank 240 being selected is a function of how often its entries appear in the free list 256, and thus reflects a current "fill" level. In an embodiment, free list(s) 256 may be used to determine logical bank fill level(s) for the purpose of weighting logical banks 240 in a selection function.

In an embodiment, complex selection functions may select logical banks 240 based on criteria such as the foregoing, or any other suitable criteria.

As already suggested, the buffer assignment logic 252 may further select specific entries 232 in the memory instances 230 to assign to the TDU. The buffer assignment logic 252 does so using the free list(s) 256. In some embodiments, each TDU is assigned a logical address within a logical bank 240, and the logical address corresponds directly (e.g. via a mapping function) to the addresses of entries 232 in which its SDUs are stored. Thus, the free list(s) 256 specifies only available logical addresses, and the assignment logic 252 only chooses a logical address.

In other embodiments, the free list(s) 256 specify specific entries 232 that are available within each memory instance 230. The entry 232 to use in a given memory instance 230 may be selected at random, based on its age in the free list 256, based on the highest or lowest available address, or using any other suitable approach. In the event the TDU has less SDUs than there are memory instances 232, the memory instances 232 in which to store the SDUs may likewise be selected using techniques such as described with respect to the logical banks 240 above.

In embodiments where the entry assignment mechanism does not involve a fixed function, in order to later determine where the data for a TDU is found, SDU-to-TDU mapping data 258 may be stored. Such data may be, for instance, a list that links a TDU identifier to addresses of specific entries 232 in which SDUs are stored for a TDU.

When an address is selected from a free list 256, it is removed from the free list 256. The address is returned to the free list 256 only after the TDU written to the address is removed from the buffer 210.

Writers and Readers

Buffer management logic 250 is coupled to multiple writer components 280, or writers 280, that perform the actual write operations for the TDUs. In an embodiment, there may be any number of writers 280. Each writer 280 supports a single write operation per memory access period. In an embodiment, each logical bank 240 may have a dedicated writer 280. In another embodiment, writers 280 may instead be configured to write to different logical banks 240 in different access periods.

A writer 280 may write a TDU using any suitable write mechanism. In an embodiment, a writer 280 may divide a TDU into SDUs. The writer 280 may then instruct the individual memory instances 230 whose entries 232 were assigned to the TDU to write the SDUs to the assigned entries 232.

Buffer management logic 250 is further coupled to multiple reader components 290, or readers 290, that perform the actual read operations for the TDUs. In an embodiment, there may be any number of readers 290. Each reader 290 supports a single read operation per memory access period. In an embodiment, each logical bank 240 may have a dedicated reader 290. In another embodiment, readers 290 may instead be configured to read from different logical banks 240 in different memory access periods. The number of readers 290 need not be the same as the number of writers 280. For instance, in an embodiment, there may be fewer readers 290 than writers 280, since a larger number of writers 280 may be needed to handle bursts of high traffic into the buffer 210.

Readers 290 process the read requests 292. Each read request 292 specifies a TDU to read from the buffer 210. The read requests 292 may specify a TDU by a logical address corresponding to the TDU (e.g. a logical buffer identifier and an address) or other suitable identifier. Optionally, a read request 292 may include additional information, such as an associated source and/or destination, priority level, or other metadata that may affect how the buffer management logic 250 services the read request 282.

Translation logic in the readers 292, scheduler 254, or another suitable component translates the read requests 292 into individual read instructions for reading specific SDUs from specific entries 232 in the memory instances 230. The translation logic may do so, for instance, by using a reverse lookup on the TDU identifier in the mapping data 258 and/or using the same mapping function(s) used by the assignment logic 252.

For example, consider a read request 292 for the TDU at an address 1.105, where the number 1 refers to a logical bank numbered "1" and the number 105 is the logical address assigned to the TDU. In embodiments that use TDU mapping data, such mapping data might indicate, for instance, that the TDU assigned to address 1.105 is stored in the entries numbered 20, 80, 19, and 7 of the memory instances numbered 5, 6, 7, and 8. Hence, a reader 290 would translate the read request 292 into instructions to the memory instances numbered 5, 6, 7, and 8 to read the entries numbered 20, 80, 19, and 7, respectively. Similarly, in an embodiment where the logical address of the TDU directly corresponds to physical addresses of the same number in the memory instances 230 (e.g. a one-to-one mapping function), a reader 290 would translate the read request 292 into instructions to the memory instances numbered 5, 6, 7, and 8 to each read their own entry address 105.

A reader 292 is coupled to the individual memory instances 230, to which it sends the translated instructions to read the mapped entries 232. In response to such instructions, the reader 292 receives SDUs back from the memory instances 230, merges the SDUs back together into a TDU, and outputs the TDU from the buffer 210.

Scheduler

Buffer management logic 250 further includes a scheduler 254. The scheduler 254 is responsible for determining when to execute the read and write operations requested by the access requests 282 and 292. The scheduler 254 selects a set of access requests to execute in a given memory access period, and sends instructions to execute the selected requests to the relevant writers 280 and/or readers 290. Generally, the scheduler 254 is configured to ensure that the set of access requests executed in a given access period (e.g. clock cycle) do not conflict with each other, though the scheduler 254 may further be configured to select sets of access requests to execute in a manner that optimizes the number of access requests that can be completed over a given time period.

Any suitable scheduling and conflict resolution techniques may be utilized. In an embodiment, the scheduler 254 may be configured to cache some or all of the access requests as they are received. For each upcoming memory access period, the scheduler 254 may select a set of access requests to execute from the cache. The selection may simply be a first-in-first-out selection. That is to say, when selecting access requests to execute in a given access period, the scheduler 254 simply selects access requests in the order they were received, until it can no longer service the next access request that was received due to conflicts with the already scheduled operation(s).

In an embodiment, the scheduler 254 may more intelligently select the set of access requests to optimize buffer read and/or write speed. For instance, if the second oldest read request in the cache conflicts with the oldest read request in the cache, the scheduler 254 may skip the second read request and select to execute the third read request instead. Moreover, in an embodiment, the scheduler 254 may schedule a number of access periods at a time, and select access requests for each access period in such a manner as to ensure that the highest number of access requests possible are executed during those access periods.

In an embodiment, the scheduler 254 may prioritize certain access requests based on associated metadata. For example, the scheduler 254 may select a read request 292 with a high-priority indicator over another read request 292, even if received after the other read request 292. In some embodiments, read requests 292 and/or write requests 282 may be scored based on certain metadata, and then selected based on some ranking algorithm or probabilistic algorithm.

In an embodiment, the selection may be constrained by the access request types. For instance, the scheduler 254 may be configured only to select a certain number of read requests 292 per clock cycle. In an embodiment, the scheduler 254 may select this number of read requests 292 even if there are other write requests 282 that arrived first. Conversely, the scheduler 254 may be configured to select a certain number of write requests 282 each clock cycle.

In an embodiment, the scheduler 254 may be configured to always execute write requests 282 immediately as they are received, caching at least some of the read requests 292 if needed. For instance, in an embodiment, the number of writers 280 may be the same as the number of possible write requests 282 that may be received in a clock cycle, while there may be significantly fewer readers 290.

In yet other embodiments, the buffer 210 may not include any cache, and must instead immediately arrange to execute all access requests 282 and 292 it receives. The buffer 210 must therefore be configured to receive no more write and read requests 282/292 than it can guarantee to handle in a given access period. The scheduler 254 thus functions solely to ensure that assignments of write requests 292 to logical banks 240 do not interfere with execution of the necessary read requests 282.

In embodiments, the scheduler 254 is particular configured to utilize a shared memory buffer, as described herein, in which memory instances 230 may belong to more than one logical bank 240. Particular scheduling techniques related to this shared memory buffer are described subsequently.

In whatever way the access requests to execute in a given access period are selected, the scheduler 254 is configured to send the requests selected for the given access period to the relevant readers 290 and/or writers 280 when that access period arrives.

Miscellaneous

Although not depicted, buffer management logic 250 may further include logic configured to perform other tasks, such as "dropping" data from the buffer 210 without it having been read, statistics collection or reporting, and/or garbage collection tasks.

FIG. 2 illustrates but one example of buffer management logic and an associated buffer. Other embodiments may include fewer or additional elements in varying arrangements. For example, there may be fewer or additional memory instances 230. Moreover, as explained subsequently, the memory instances 230 may be grouped into additional logical banks 240

In some embodiments, the division of work may vary between the different components. For instance, TDUs may be divided into SDUs prior to reaching the writers 280. As another example, the logic for translating a TDU read request into individual SDU read requests may be executed outside of the readers 290. In an embodiment, the scheduler 254 may be responsible for translating TDU access requests into SDU access instructions. The scheduler 254 may schedule the individual SDU access instructions instead of the TDU access requests.

In some embodiments, the scheduler 254 may be integrated with the buffer assignment logic 252 so as to optimize buffer assignments based on logical bank availability in upcoming memory access periods.

2.3. Shared Memory Instances and Parity Data

According to embodiments, two logical banks may share a memory instance. For example, the logical banks 240 in FIG. 2 share the memory instance 230*f*. Conventionally, such an arrangement would prevent the logical banks from being accessed at the same time. However, according to embodiments, this limitation may be removed for read operations by including an extra memory instance in at least one of the logical banks that share the memory instance.

The extra memory instance should be the same width as other memory instances, and moreover the extra memory instance may be shared by another logical bank just as any other memory instance. The added capacity from the extra memory instance permits storage of a parity SDU, though the parity SDU may be stored within any memory instance of the logical bank (i.e. not necessarily the last, or "extra," memory instance). A logical bank that includes the extra memory instance is also referred to herein as a "parity bank," and by contrast a logical bank that does not include an extra memory instance is referred to herein as a "non-parity bank."

When a TDU writer writes a TDU to a logical bank with an extra memory instance, it may generate a parity SDU and store the parity SDU in one of the memory instances. If both logical banks that share a memory instance are accessed at the same time, a reader of a logical bank with an extra memory instance may skip reading the shared memory instance, and instead reconstruct the missing SDU from the memory instance using the parity SDU.

The parity SDU is not an actual portion of the TDU, but is rather parity data by which any one SDU that is missing from the TDU may be reconstructed via a parity operation, assuming all other SDUs are available. The parity SDU may be generated and utilized in accordance to any suitable parity technique. For example, in an embodiment, an XOR operation is used as the parity operation. The parity SDU is calculated by performing an XOR operation between all of the SDUs in the TDU. Any single SDU in the TDU that may be missing may then be reconstructed by performing an XOR operation between the parity SDU and all of the other SDUs in the TDU.

As an example of utilizing an extra memory instance for two logical banks that share a memory instance, consider the logical banks 240 in FIG. 2. One of the logical banks, labeled 240a, has an extra memory instance 230g. When writing to this logical bank 240a, a writer 280 may calculate a parity SDU and store that parity SDU in memory instance 230g (or in any other memory instance 230 within the logical bank 240a). If logical banks 240a and 240b are subsequently read at the same time, the memory instance 230f may be read for logical bank 240b, and skipped for logical bank 240a. The parity SDU in logical bank 230g may then be used in a parity operation to reconstruct the SDU that would have been read from memory instance 230f for logical bank 240a.

The scheduling of access operations for logical banks that share memory instances involves special considerations. When scheduling reads for a parity bank and a non-parity bank that share a memory instance, for example, the scheduling logic of the buffer manager should prioritize the non-parity bank, since that logical bank would be unable to use parity information to recover an SDU in a memory instance it cannot read. In an embodiment, to ensure that the non-priority bank has access to the shared memory instance, the scheduling logic may, for instance, send instructions with the read requests that indicates to the readers exactly which memory instances to read (and possibly even the specific entries to read within those instances).

Of course, simply because two logical banks share a memory instance does necessarily mean that a given TDU in one of the logical banks will have an SDU stored in the shared memory instance, since the shared memory instance may have been used to store a parity SDU, or the given TDU may have fewer than the maximum number of SDUs. In such cases, no parity operation would be necessary. Moreover, the scheduling logic may be configured to leverage the fact that no parity operation will be needed to schedule another concurrent read operation for a third logical bank that shares another memory instance with one of the two logical banks, since a parity operation may then instead be relied upon to recover contents of the other memory instance.

In an embodiment, a full-sized TDU write operation (i.e. a write operation for a TDU that spans all of the memory instances in a logical bank) may be performed in a non-parity bank while performing a full-sized TDU read operation in the parity bank that shares the memory instance with the non-parity bank. However, two full-sized TDU write operations could not be performed in overlapping logical banks concurrently. Nor could a full-sized TDU write operation be performed in the parity bank concurrently with a full-sized TDU read operation in the non-parity bank, since a full-sized TDU write operation requires access to all memory instances in a parity bank.

2.4. Horizontal and Vertical Logical Banks

In an embodiment, there are two different types of logical banks—horizontal logical banks and vertical logical banks. Conceptually, and as depicted in FIG. 2, the memory instances are arranged in a matrix, also referred to as a grid. Each horizontal logical bank is composed of memory instances along a different row of the matrix. Each vertical logical bank is composed of memory instances along a different column of the matrix. Each memory instance is, consequently, shared by two logical banks. Note that the terms "horizontal" and "vertical" are used for conceptual purposes only, and do not necessarily indicate any physical aspect of the arrangement of memory instances.

At least one logical bank in each pairing of a horizontal bank and vertical bank that share a memory instance should include an extra memory instance beyond what is necessary to store a maximum-size TDU. Though other arrangements may be possible, the simplest way to ensure the existence of the extra memory instance is to require that all logical banks in one direction have the extra memory instance. Thus, for example, in FIG. 2, all horizontal logical banks 240 would have an extra memory instance 230. Of course, for added flexibility, logical banks in both directions may have an extra memory instance, though this is not essential.

In an embodiment, the direction of a logical bank is associated with some attribute of the TDUs it stores. For instance, the direction of a logical bank may be associated with the source or destination of the TDUs within the logical bank. Thus, for instance, horizontal logical banks may be associated with one downstream component within the implementing device, while vertical logical banks may be associated with another downstream component within the implementing device. Because at least one vertical logical bank and at least one horizontal logical bank may be read concurrently, this arrangement may be utilized to guarantee at least one read operation for each of the two downstream components each memory access period, assuming data is stored for each downstream component in the buffer.

Moreover, this arrangement permits sharing of a buffer between multiple entities. In conventional arrangements, a memory instance would belong to only one logical bank, which would be associated with either one downstream component or another. Hence, if a first downstream component was relatively overutilized compared to a second, the first downstream component might exhaust its buffer while the second might still have a significant amount of buffer space still available that would be inaccessible to the first downstream component. With the matrix configuration, however, since each memory instance belongs to two different logical banks in two different directions, each memory instance is available for each downstream component, allowing for more efficient memory utilization.

In an embodiment, the matrix configuration may permit all banks in the parity direction (i.e. the direction whose logical banks are parity banks) to be read each access period (using the parity data), even if one of the non-parity banks is being read or written. If both directions of logical banks are parity banks, then all banks in any one direction may be read each access period, while another operation is performed in the other direction. A scheduler may alternate directions in different access periods to maximize read capacity.

Example Concurrent Operations in a Grid

Figure 3A:
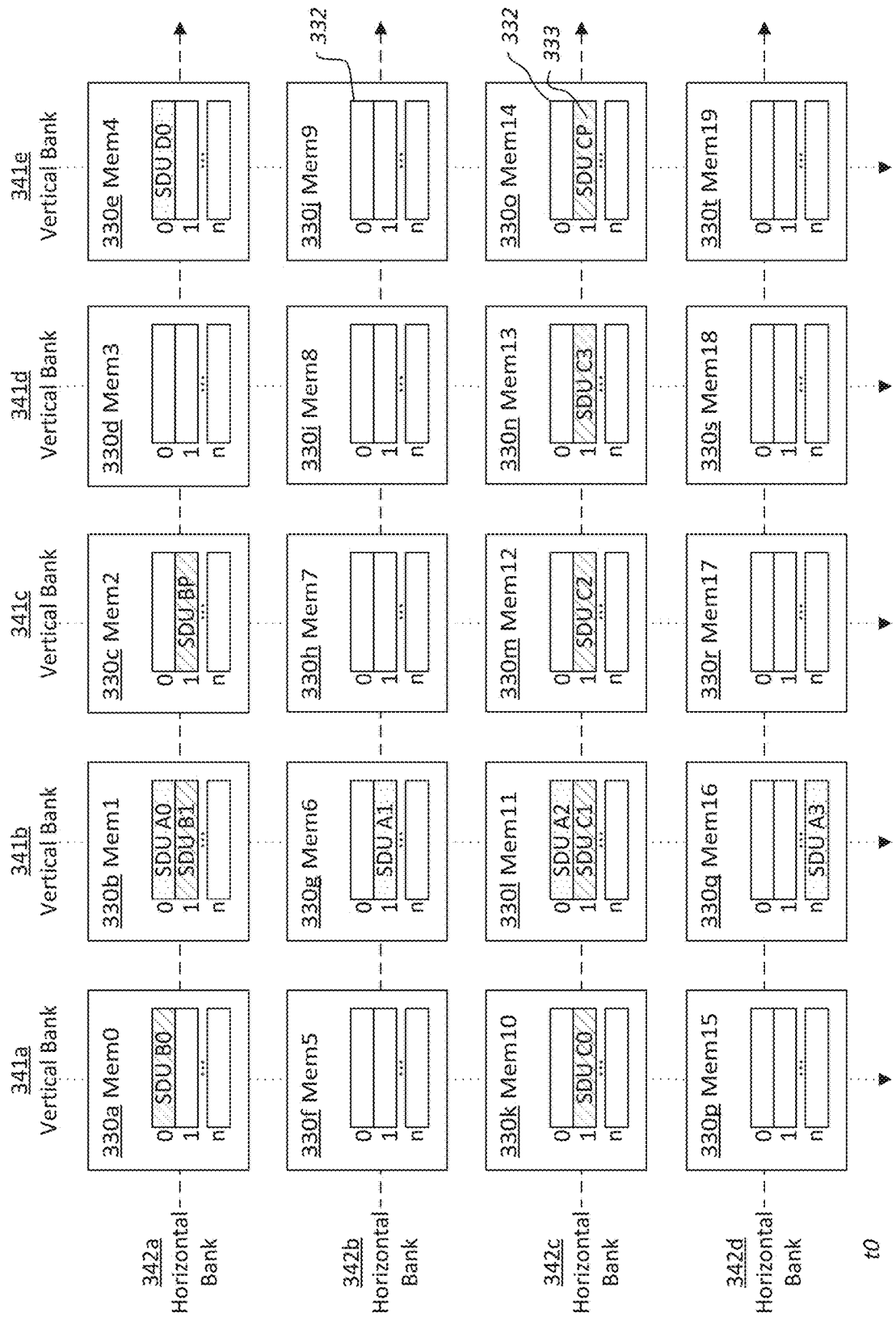

FIGS. 3A-3E illustrates the concurrent use of horizontal and vertical logical banks that share memory instances with respect to example data, according to an embodiment. FIG. 3A depicts example contents of a buffer 300 at a time t0. Buffer 300 is an example of a buffer 210, though buffer 300 may also be utilized in embodiments without the specific details of FIG. 2. Buffer 300 comprises a five-by-four grid of memory instances 330a-t (collectively "memory instances 330," or "memories 330"). Memory instances 330 are arranged into vertical logical banks 341a-e (collectively "vertical banks 341") and horizontal logical banks 342a-d (collectively "vertical banks 341"). There are more memory instances in horizontal banks 342 on account of horizontal banks 342 being parity banks. A consequence of this arrangement is that there are more vertical banks 341 than logical banks 342.

The contents of three SDU entries 332 are depicted for each memory instance 330, numbered 0, 1, and n, though it will be appreciated that each memory 330 may in fact have many more SDU entries 332. The SDUs 162 for the four TDUs 160 shown in FIG. 1 are depicted as being stored in these entries 332.

For instance, TDU A is stored in vertical bank 341b. More specifically, vertical bank 341b comprises memory instances 330b, 330g, 330l, and 330q. SDU A0 of TDU A is stored in entry 0 of memory instance 330b. SDU A1 is stored in entry 1 of memory instance 330g. SDU A2 is stored in entry 0 of memory instance 330i. Finally, SDU A3 is stored in entry n of memory instance 330q. As with any TDU, buffer management logic may store a mapping of an identifier associated with TDU A to the entries 332 in which the SDUs for TDU A are stored, such as in TDU maps 258, so as to locate these entries 332 when it is time to read TDU A.

As another example, TDU C is stored in horizontal bank 342c. More specifically, horizontal bank 342c comprises memory instances 330k-o. SDU C0 of TDU C is stored in entry 1 of memory instance 330k. SDU C1 is stored in entry 1 of memory instance 330l. SDU C2 is stored in entry 1 of memory instance 330m. Finally, SDU C3 is stored in entry 1 of memory instance 330n. Additionally, since the horizontal banks 342 are parity banks, a parity SDU 330, labeled SDU CP, has been generated and stored in entry 1 of memory instance 330o.

Horizontal bank 342c overlaps with vertical bank 341b, in that they share memory instance 330l. Accordingly, TDU A and TDU C both have data in the same memory instance 330l. In single-ported embodiments, or in any embodiment where memory instance 330l might need to be accessed more times in an access period than the hardware permits, a parity operation may be utilized if TDU A and TDU C need to read concurrently, as described elsewhere herein.

Although in the two examples just given, the SDUs have been stored in consecutive memory instances 330 in the same order as they are found in their respective TDUs, it is not necessary that they be stored consecutively. For instance, SDU C0 could swap places in horizontal bank 342c with any other SDU of TDU C, including SDU CP. The memory map for TDU C would simply indicate an order for the SDUs in addition to the specific entries 330 in which they are found. The memory map would further indicate which SDU was the parity SDU Note that smaller TDUs, such as TDU B, may span fewer than the total number of instances in the logical bank 341/342 in which they are stored. A parity SDU would still be generated for these smaller TDUs if they are in a parity bank. In an embodiment, a parity SDU could also be generated for any TDU that does not require all of the memory instances in a logical bank 341, even if the logical bank 341 is not a designated parity bank. Such a parity SDU may provide additional flexibility to scheduling logic to schedule reads in banks 341/342 that overlap.

Figure 3B:
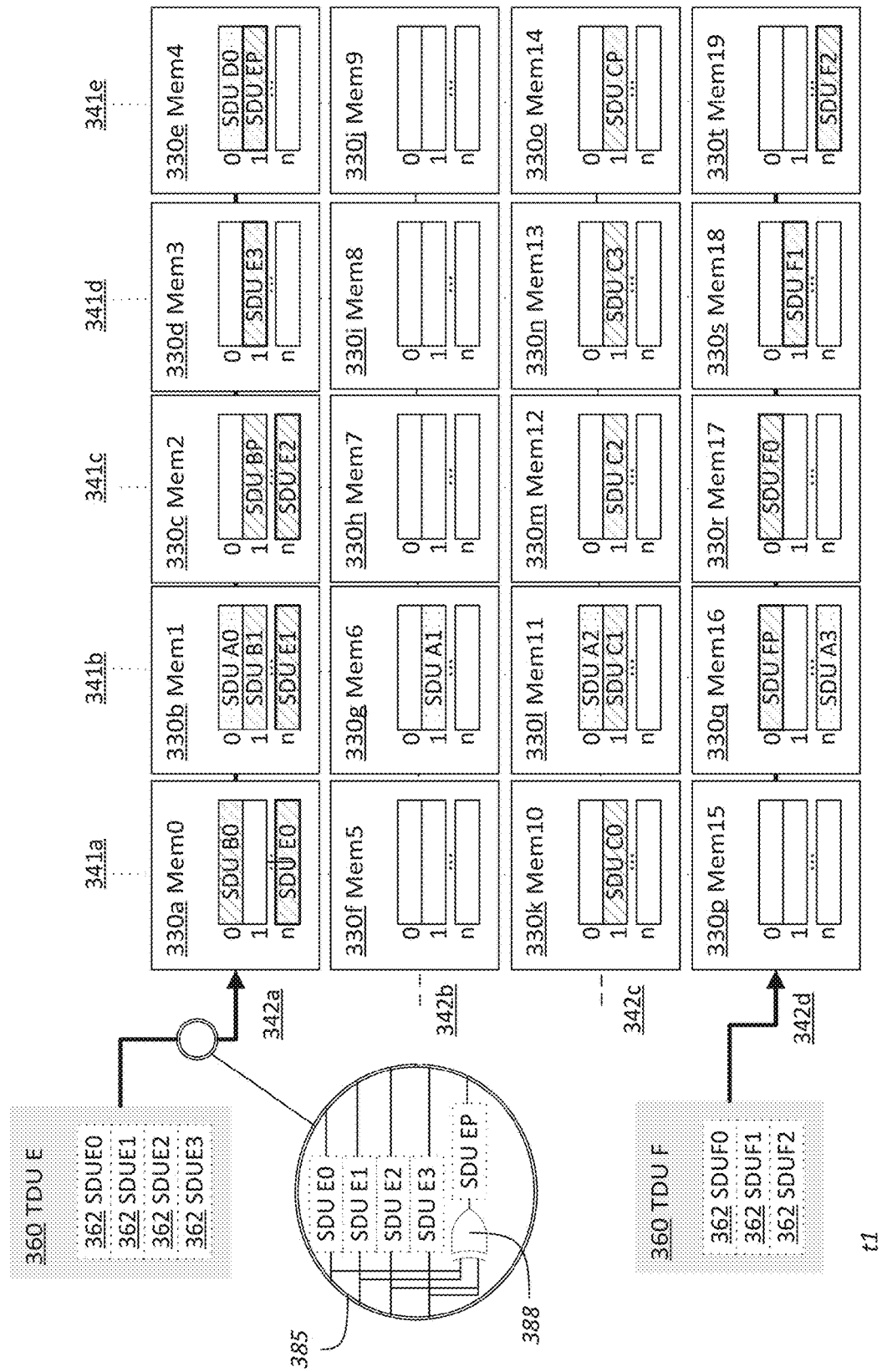

FIG. 3B depicts example contents of the buffer 300 at a time t1, which is a clock cycle in which two TDUs 360 are being written to the buffer 300. The time t1, like other times depicted in FIGS. 3A-3E, is simply any time subsequent to the time depicted in the immediately previous figure. There may or may not have been any intervening clock cycles between t0 and t1.

TDUs 360, labeled TDU E and TDU F, each comprise a set of SDUs 362. TDU E comprises four SDUs 362, labeled SDU E0-SDU E3. TDU F comprises three SDUs 362, labeled SDU F0-SDU F2. The buffer management logic has assigned TDU E to horizontal bank 342a, and TDU F to horizontal bank 342d. Since all logical banks of the same direction in a grid can be written in the same clock cycle, there is no conflict in writing these two TDUs 360 simultaneously.

Writing the TDUs 360 to their respective horizontal banks 342 involves selecting the entries 332 to which their respective SDUs 362 are to be written, and then writing the SDUs to their selected entries. Hence, SDU E0 is written to entry n of memory instance 330a, SDU E1 is written to entry n of memory instance 330b, and so forth. Since horizontal banks 342 are parity banks, writing the TDUs 360 further involves generating a parity SDU, and writing the parity SDU. For instance, the parity SDU for TDU F is labeled SDU FP, which was written in memory instance 330g of horizontal bank 342d.

The components responsible for writing to horizontal banks 342, such as writers 180, may include any suitable mechanism for generating parity SDUs. For instance, FIG. 3B depicts example parity-generation circuitry 385, whereby the SDU E0-SDU E3 are each inputted into a parity operation 388, such as an XOR operation, to generate the parity SDU, labeled SDU EP, for TDU E.

FIG. 3C depicts example contents of the buffer 300 at a time t2, which is a clock cycle in which two additional TDUs 360 are being written to the buffer 300. The two additional TDUs 360, labeled TDU G and TDU H, are being written to vertical banks instead of horizontal banks. More specifically, TDU H is written to vertical bank 341a and TDU G is written to vertical bank 341c. For instance, SDU G0 of TDU G is written to entry 0 of memory instance 330c in vertical bank 341c, SDU G1 is written to entry 1 of memory instance 330h in vertical bank 341c, and so forth. The vertical banks 341 are not parity banks. Hence, no parity SDU is generated.

Figure 3D:
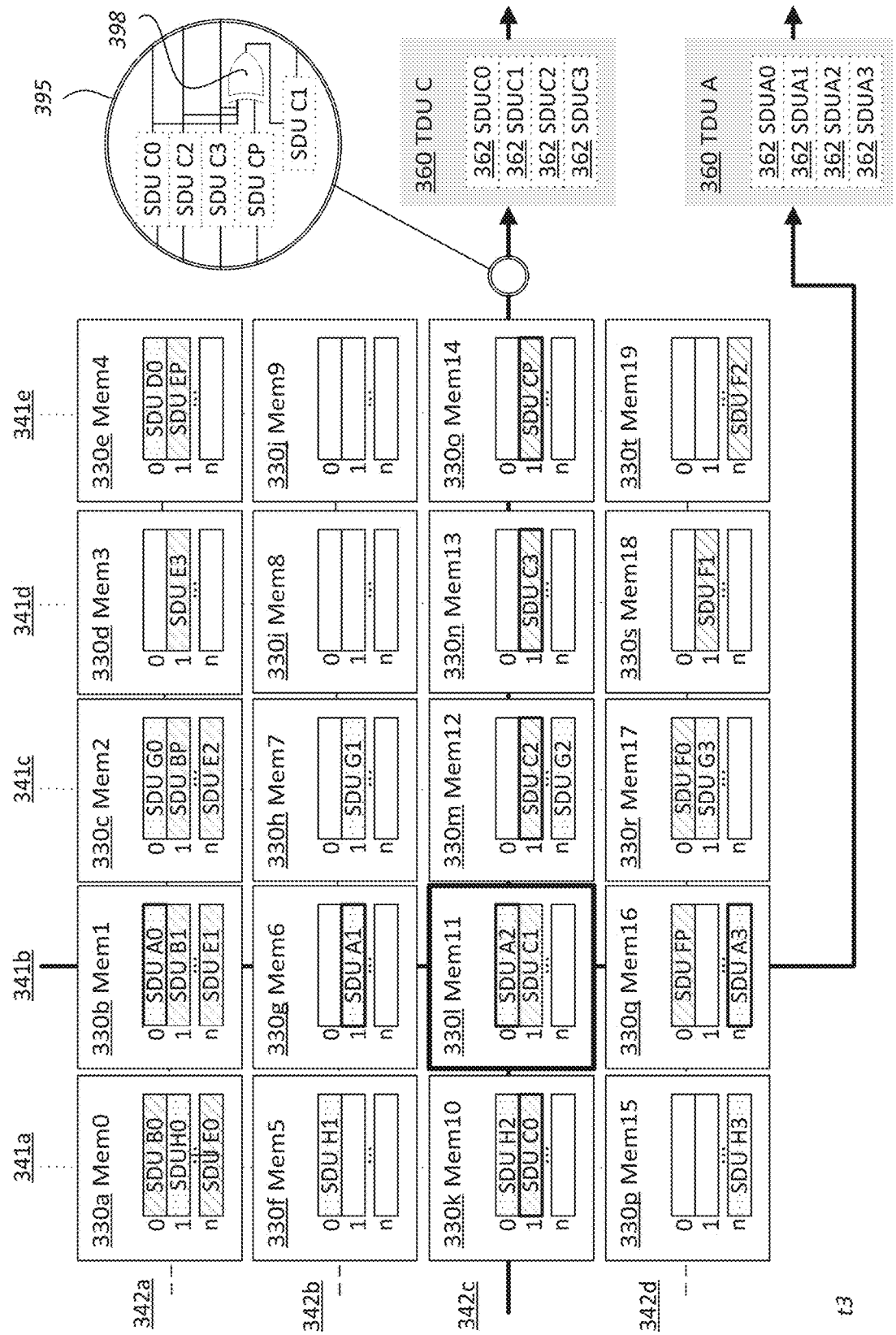

FIG. 3D depicts example contents of the buffer 300 at a time t3, which is a clock cycle in which two TDUs 360 are being read from the buffer 300. Specifically, the TDUs labeled TDU A and TDU C have been requested. The reading of TDU A is given priority, since it is a read of a non-parity bank. The reading of TDU A involves determining which logical bank TDU A is stored in (vertical bank 341b), looking up the entries 332 mapped to TDU A within that logical bank (entry 0 of memory instance 330b, entry 1 of memory instance 330g, etc.), and reading those entries 332.

The reading of TDU C is complicated by the fact that the reading of TDU A has already accessed memory 330l. Again, the reading of TDU C involves determining the appropriate logical bank 342 and entries 332 to read. However, in a single-ported embodiment of buffer 300, the entry 332 in which SDU C1 is stored will be inaccessible, since the memory instance 330l will already have been read for TDU A. Hence all other entries 332 mapped to TDU C are read. Specifically, SDU C0 is read from entry 1 of memory instance 330k, SDU C2 is read from entry 1 of memory instance 330m, SDU C3 is read from entry 1 of SDU C3, and the parity SDU, SDU CP, is read from memory instance 330o. Example logic 395 for reconstructing the missing SDU C1 from the other SDUs is depicted. This logic involves inputting SDU C0, SDU C2, SDU C3, and SDU CP into a parity operation 398, which may again be an XOR operation or any other suitable operation. The output of this operation is used in place of the missing SDU C1. The SDUs C0-C3 are then outputted as the TDU C.

Figure 3E:
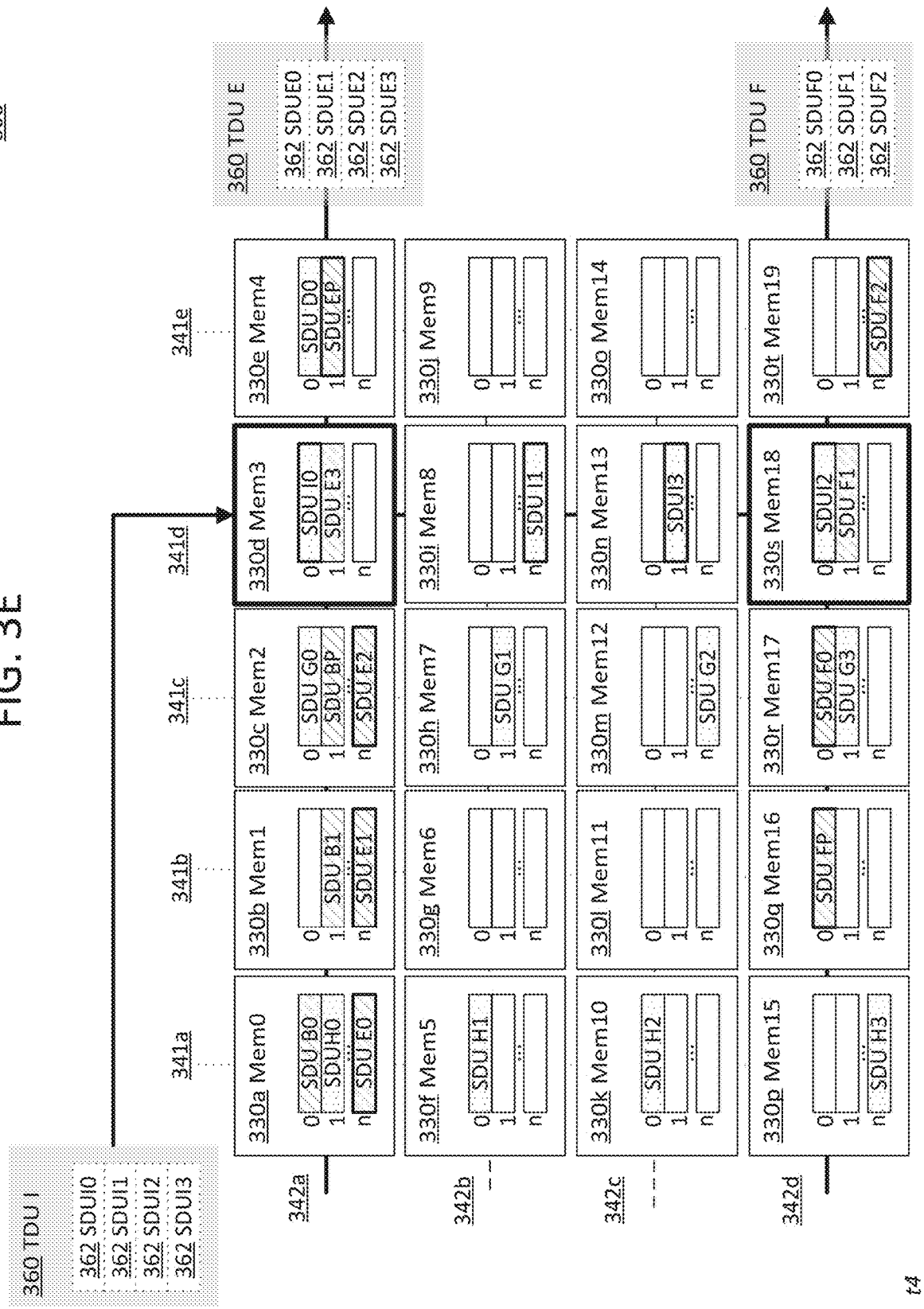

FIG. 3E depicts example contents of the buffer 300 at a time t4, in which multiple TDUs 360 are being read while another TDU 360 is being written. A TDU labeled TDU I is being written to a vertical bank 341d, comprising memory instances 330d, 330i, 330n, and 330s. At the same time, TDU E is being read from horizontal bank 342a and TDU F is being read from horizontal bank 342d. Both reads are parity reads, as the SDU E3 and SDU F1 cannot be read from the memory instances 330d and 330s in which the SDUs are respectively stored. Hence, parity operations with SDU EP and SDU FP are utilized to reconstruct SDU E3 and SDU F1, respectively, in similar manner to that explained with respect to the reading of TDU C in FIG. 3D.

Note that the contents of TDU C and TDU A are no longer depicted in the buffer 300 at time t4, on account of their respective entries 332 having been removed from the buffer 300 after being read at time t3. This may have occurred through any suitable deallocation and/or garbage collection processes. The data for the removed contents may or may not still reside in their respective entries 332, depending on the embodiment. In either case, however, the entries 332 have been returned to the free list and are available for storing new data.

Variations

FIGS. 3A-3E illustrate but one example implementation of the buffering techniques described herein. Of course, the data, sequence of operations, entry assignments, and so forth would vary from instance to instance. Moreover, other implementations may include different numbers of memory instances 330 in the logical banks 341 and 342, which may be the result of one or more of: smaller memory instances 330, larger TDUs 360, larger numbers of SDUs in a TDU 360, and/or the ability to store a full TDU in fewer than all memory instances 330 of a logical bank 341/342. Although the horizontal banks 342 are depicted as the parity banks, it will be appreciated that the direction of horizontal banks 342 and vertical banks 341 is arbitrary, and could very well be reversed. Hence, horizontal banks 342 should simply be understood as a first set of logical banks and vertical banks should be understood as a second set of logical banks.

Moreover, in an embodiment, vertical banks 341 may also be parity banks, in which case the number of memory instances in both horizontal banks 341 and 342 may be the same. Moreover, the number of vertical banks 341 and 342 would therefore be the same as well. Such an arrangement would add additional flexibility to the scheduling of operations. For instance, multiple vertical banks 341 could be read at the same time as a horizontal bank 342 is accessed, inverting the arrangement depicted in FIG. 3E.

In an embodiment, not all memory instances 330 in a grid need to be shared by multiple logical banks 341/342. For instance, in an embodiment, the last column of the grid may be dedicated for storing parity SDUs of the grid and not used for vertical banks 341. Optionally, memory instances 330 in the column might have fewer entries for storing data. As another example, one or more other rows and/or columns of the grid may not be shared. For instance, in a networking context, the first SDU of a TDU may always be stored in the first memory instance within a logical bank. Since all TDUs have at least one SDU, but not necessarily more than one SDU, the first memory instance would always be accessed whenever the logical bank was being accessed. Hence, it may be beneficial not to share the first memory instance with a logical bank in the other direction, to reduce the likelihood of conflicts.

Although only one TDU is depicted as being read or written to a logical bank 341/342 in a given clock cycle, it will be appreciated that one or more additional TDUs may be read or written in the clock cycle, if not all memory instances 330 are accessed by the first memory instance. For instance, when TDU D was written to vertical bank 341e, only a single SDU D0 was written in memory instance 330e. Therefore, one or more additional TDUs may have been scheduled for writing to other memory instances 330 in vertical bank 341e at the same time.

In an embodiment, not all TDUs written to a logical bank with an extra memory instance need be written with a parity SDU. TDUs that lack a parity SDU may be written to such logical banks, so long as the scheduler is configured not to schedule reads for that TDU that would conflict with reads in a different direction. Conversely, in an embodiment, a parity SDU may be written in a logical bank that lacks an extra memory instance, if not all memory instances in that logical bank are needed for a TDU. Hence, in some embodiments, there may not necessarily be any logical banks with extra memory instances, but rather full-sized TDUs are always scheduled as non-parity read operations while smaller TDUs may be scheduled as parity read operations.

Although only a couple of write operations are depicted in FIGS. 3B and 3C, it will be appreciated that each logical bank in the same direction may be written concurrently. Moreover, in FIG. 3D, it will be appreciated that each horizontal bank could be read at the same time in the same manner as horizontal bank 342c. Likewise, in FIG. 3E, horizontal banks 342b and/or 342c could also be read in t4. In another embodiment, the ability to write to a grid concurrently with reading, as in FIG. 3E, is an optional feature that need not necessarily be implemented.

In an embodiment, more than one copy of the parity SDU may be stored in a logical bank. For instance, a logical bank may include more than one extra memory instance. Or, a writer may be configured to write copies of the parity SDU to any memory instances of a logical bank that are not used to store a non-parity SDU, so that smaller SDUs might have two or more copies of their parity SDUs available. Such additional parity SDUs may provide additional flexibility to scheduling logic to schedule reads in logical banks that overlap.

2.5. Diagonal Logical Banks

According to an embodiment, a memory instance may be shared by three logical banks. In such an embodiment, a grid of memory instances may be arranged into three different directions of logical banks—horizontal and vertical, as already discussed, as well as diagonal. Such a grid would require that all three directions of logical banks be parity banks, and hence the grid would include the same number of memory instances in each direction.

Rather than its memory instances being entirely on the same row or the same column of the grid, a diagonal logical bank includes one memory instance from each row and each column. The memory instances follow non-overlapping diagonals in the grid, wrapping around to the other side of the grid when they reach the end of the grid. In some embodiments, the diagonals may proceed from left to right as they proceed down the grid, while in other embodiments the diagonal may proceed from right to left. Of course, as with the horizontal and vertical banks, the direction of the diagonal is merely a conceptual means of mapping memory instances to a logical bank, and does not actually correspond to any physical aspect of the memory instances.

A diagonal bank may be read concurrently with a horizontal bank and a vertical bank. Each of the three logical banks being read concurrently would either have one memory instance that is shared with both of the other two logical banks, or have two memory instances that are shared, each with a different one of the other two logical banks. In the first case, one of the logical banks may be given access to the shared memory instance, while the other two logical banks would need to skip reading the shared memory instance. The other two logical banks would then reconstruct the data in the shared memory instance, if necessary, using a parity SDU, as described in other sections. Although not necessary, in some embodiments, the logical bank that has access to the shared memory instance may be selected based on where parity SDUs are being stored for the TDUs being read. Thus, a logical bank reading a TDU that does not have a parity SDU in the shared memory instance may be given access to the shared memory instance, if possible, so as to reduce the need for parity operations.

In the latter case where two memory instances that are shared in each logical bank, the logical banks need to be carefully scheduled so that each logical bank skips a memory instance to which one of the other logical banks is given access. Each logical bank would then reconstruct the data in the memory instance it skipped, if necessary, using a parity SDU, as described in other sections. Again, the memory instance skipped by a logical bank may be selected based on where the logical bank stores its parity SDU for the TDU being read, so as to reduce the need for parity operations.

Example Data

Figure 4A:
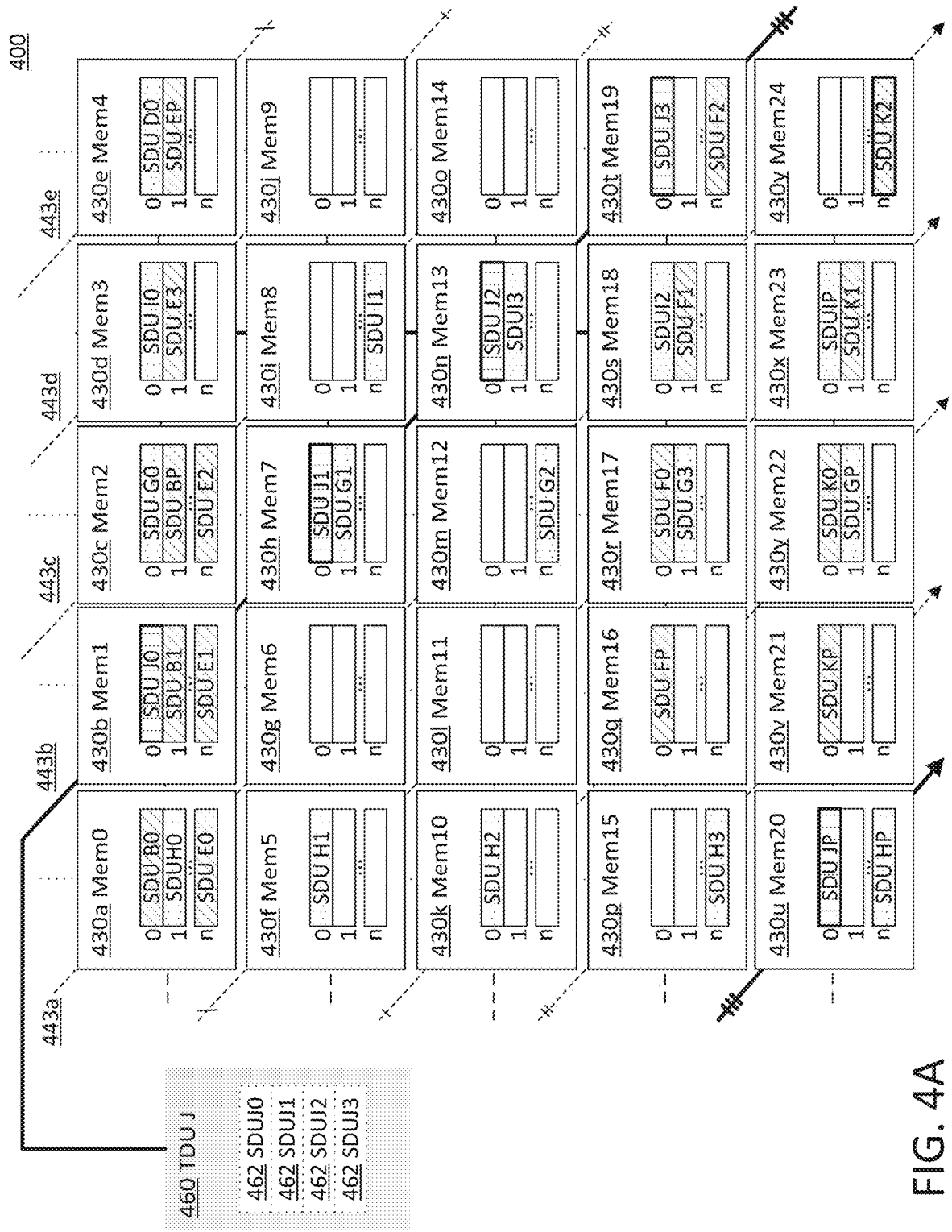
FIGS. 4A and 4B illustrates the concurrent use of diagonal logical banks that share memory instances with horizontal logical banks and vertical logical banks, with respect to example data.
Figure 4B:
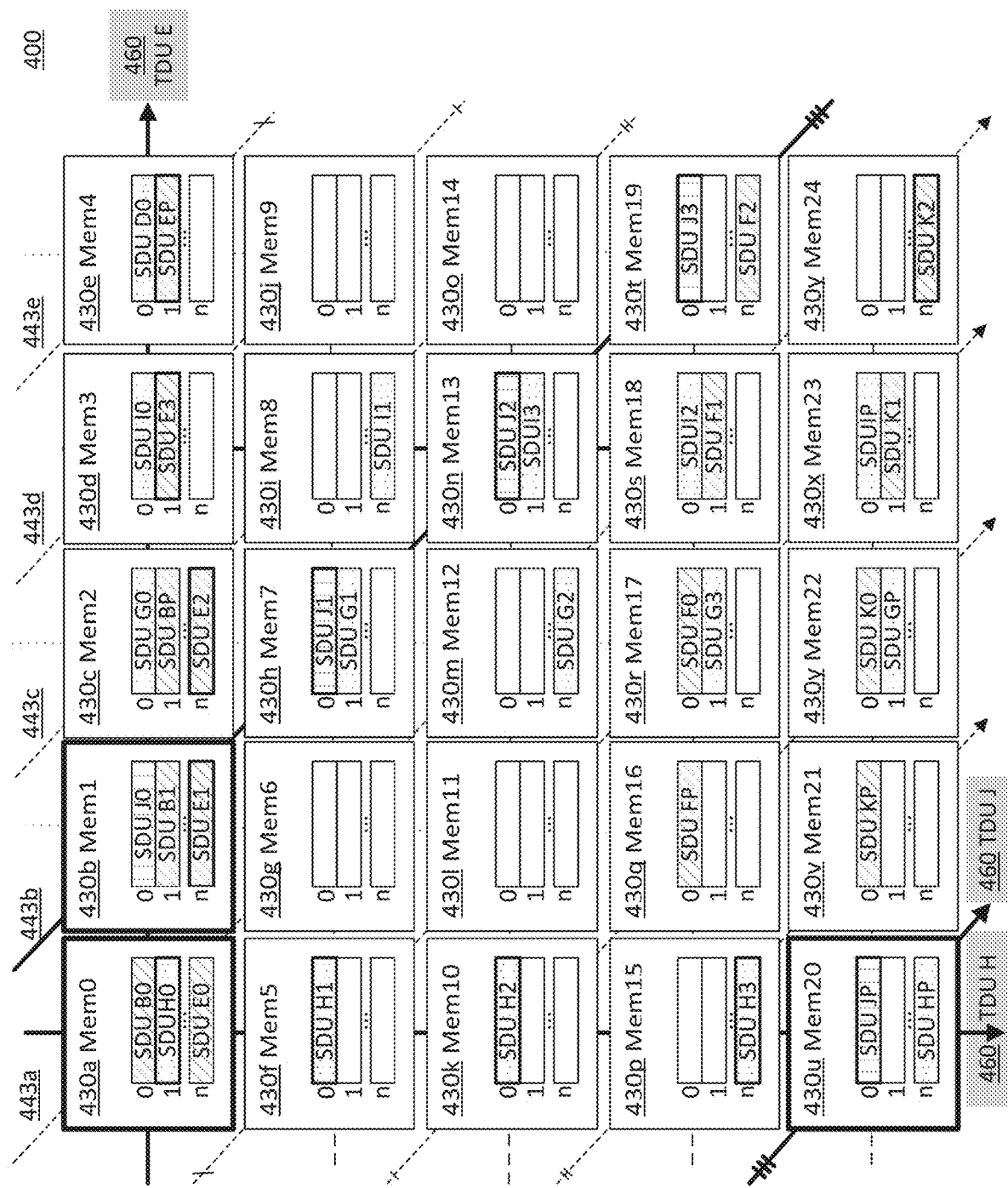

FIGS. 4A and 4B illustrates the concurrent use of diagonal logical banks that share memory instances with horizontal logical banks and vertical logical banks, with respect to example data, according to an embodiment. FIG. 4A depicts example contents of a buffer 400 at a time t0, as a TDU 460 is being written to a diagonal logical bank 443. Buffer 400 is another example of a buffer 210, though buffer 400 may also be utilized in embodiments without the specific details of FIG. 2. Buffer 400 comprises a five-by-five grid of memory instances 430a-y (collectively "memory instances 430," or "memories 430"). As with memory instances 330, memory instances 430 are arranged into vertical logical banks and horizontal logical banks, though the vertical logical banks in buffer 400 differ from those in buffer 300 in that they store parity data as well. Example data similar to that shown in FIG. 3D is depicted as being stored in these horizontal and vertical logical banks.

Additionally, memory instances 430 are arranged in diagonal logical banks 443a-e (collectively "diagonal banks 443"). For example, as depicted, a TDU 460, labeled TDU J, is being written to diagonal bank 443b. Diagonal bank 443b comprises memory instances 430b, 430h, 430n, 430t, and 430u, which proceed along one of five different depicted diagonals of the grid. SDU J0 of TDU J is written to entry 0 of memory instance 430b, SDU J1 is written to entry 0 of memory instance 430h, SDU J2 is written to entry 0 of memory instance 430n, SDU J3 is written to entry 0 of memory instance 430t, and a parity SDU JP is written to memory instance 430u.

FIG. 4B depicts example contents of buffer 400 at a time t1, as three TDUs 460 are being read from overlapping logical banks. TDU J is being read from diagonal bank 443b.

Additionally, a TDU E is being read from a horizontal logical bank that overlaps diagonal bank 443b at memory instance 430b, and a TDU H is being read from a vertical logical bank that overlaps diagonal bank 443b at memory instance 430u. The horizontal bank and vertical bank also overlap each other at memory instance 430a.

Because of the overlapping memory instances 430, each read operation must skip one of the memory instances 430 in its corresponding logical bank. One valid configuration of the read operations is that the read operation on the horizontal bank skips memory instance 430a, the read operation on the diagonal bank 443b skips memory instance 430b, and the read operation on the vertical bank skips memory instance 430u. Hence, the read operation for TDU E reconstructs the skipped SDU E0 from memory instance 430a using SDU EP from memory instance 430e, and the read operation for TDU J reconstructs the skipped SDU J0 from memory instance 430b using a parity operation with SDU JP from memory instance 430u. No parity operation is necessary for the TDU H, since the skipped SDU HP in memory instance 430u was the parity SDU. Though, if this had not been the case, the skipped SDU from memory instance 430u could likewise have been reconstructed for TDU H using a parity SDU from another memory instance.

Another valid configuration of the read operations is that the read operation on the horizontal bank skips memory instance 430b, the read operation on the diagonal bank 443b skips memory instance 430u, and the read operation on the vertical bank skips memory instance 430a. Again, parity operations would be used to recover the skipped SDUs, in similar manner as explained above.

FIGS. 4A-4B illustrate but one example implementation of the buffering techniques described herein. Other implementations and embodiments may vary in similar manner to those explained with respect to FIGS. 3A-3E. Moreover, the diagonal banks 443 may be arranged to slant in the opposite direction 2.6. Multiple Grids According to an embodiment, a buffer may comprise two or more grids of memory instances. Each grid has its own sets of overlapping horizontal banks and vertical banks. Some or all of the grids may also have diagonal banks, if implemented.

The buffer management logic may utilize the multiple grids to more optimally schedule access operations during a given memory access period. For instance, the buffer management logic may reserve one grid for write operations, and one grid for read operations. In an embodiment, the read grid and write grid may alternate between memory access periods. In another embodiment, the highest priority read operation may be scheduled first, and the grid in which the logical bank targeted by that read operation resides may thus be reserved for read operations. Additional read operations targeting the read grid may be scheduled, to the extent possible, using the parity-based techniques described herein. The other grid may be reserved for write operations. A direction for the write operations may be chosen using any suitable logic (e.g. in an alternating pattern, based on fill level, etc.). All of the write operations may be scheduled in the same direction.

In some embodiments, the buffer management logic may also schedule a read operation for the write grid (e.g. if there is only one write operation, or if there is otherwise a non-conflicting read operation that can be performed). Conversely, the buffer management logic may also schedule a write operation for the read grid if possible.

Of course, there may be any number of grids in a buffer. Different numbers of grids may be reserved for read operations and write operations, depending on the embodiment. Moreover, as previously explained, different directions may be associated with different attributes of the data stored therein, such as the destination of the TDU. In an embodiment, the grids may be scheduled in such a manner as to guarantee a certain number of read and/or write operations per attribute.

Figure 5:
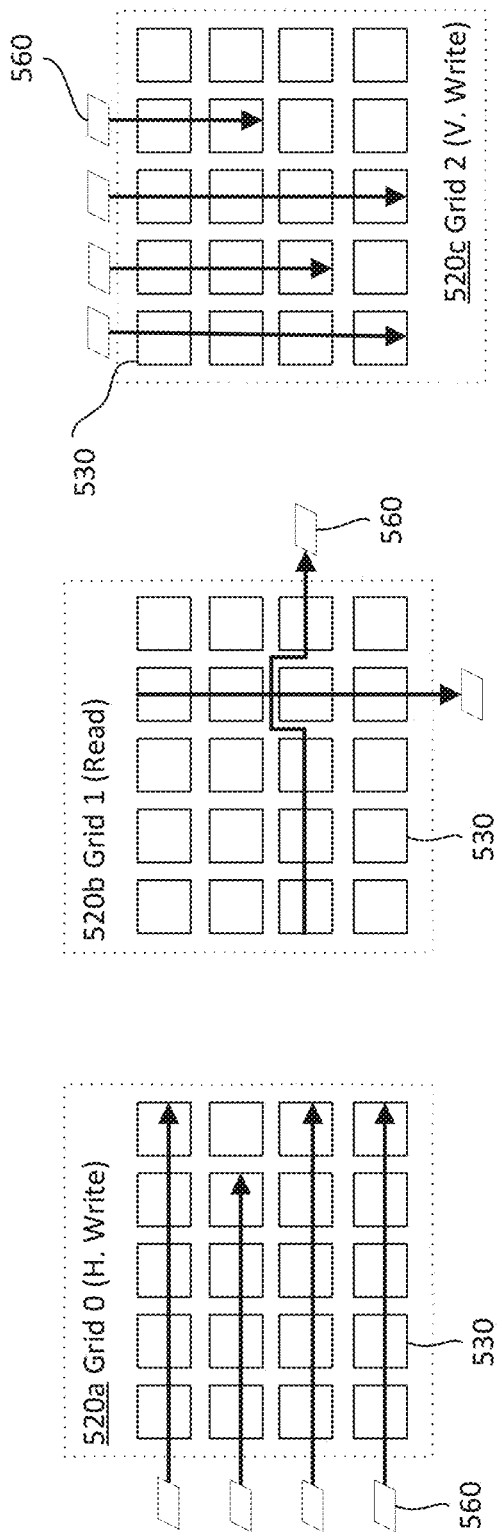
FIG. 5 illustrates an example buffer comprising three grids of memory instances in which transport data units ("TDUs") may be stored.

For example, FIG. 5 illustrates an example buffer 500 comprising three grids 520a-c (collectively grids 520) of memory instances 530 in which TDUs 560 may be stored, according to an embodiment. In the grids 520, horizontal logical banks are associated with a first destination, while vertical logical banks are associated with a second destination. In any given memory access period, one of the grids 520 is selected for read operations. For example, in the depicted clock cycle, grid 520b is selected. The grid 520 selected for the read operation may be selected based on the fill level of the memory instances 530 in the grid 520, priority of the read operations, on a random or round-robin basis, or using any other suitable selection logic.

One horizontal read operation and one vertical read operation from the selected grid are guaranteed each clock cycle, thus meaning that each destination is guaranteed a TDU to read each clock cycle, assuming one is available in the selected grid. The two reads in opposite directions are guaranteed on account of the horizontal banks in grid 520b being parity banks, meaning that reads from horizontal banks may skip over a memory instance 530 that they share with the vertical bank that is also being read in that clock cycle. The contents of the skipped memory instance 530 are then recovered using the parity-based techniques described herein.

The other two grids 520 are reserved for write operations. One of the grids—in this case grid 520a—is reserved for horizontal write operations, thereby guaranteeing that as many TDUs may be written for the first destination as there are horizontal banks in grid 520a—in this case four. The other of the grids—in this case grid 520b—is reserved for vertical write operations, thereby guaranteeing that as many TDUs may be written for the second destination as there are vertical banks in the grid 520c—in this case five.

The write directions in each grid 520 are chosen using any suitable selection mechanism. For instance, grids 520 may cycle through reading and writing in the different write directions. Or, after selecting the grid to read, the remaining grid with the lowest fill level in a certain direction may be selected for writing in that certain direction. Or, the direction to write to a grid may be selected at random, or based on a recent history of write directions (so as to balance a direction's fill level between the grids 520 over time).

In some embodiments, if there are still access operations that can be performed after all possible access guarantees have been made, the buffer management logic may schedule additional operations other than those depicted, such as additional horizontal reads of grid 520b, or a read of a TDU stored only in memory instances not being accessed in grid 520c (e.g. a TDU in only the unread columns of the last row of grid 520c). Moreover, if the vertical read in grid 520b is not needed, it may, in an embodiment, be replaced with a write operation.

Figure 6:
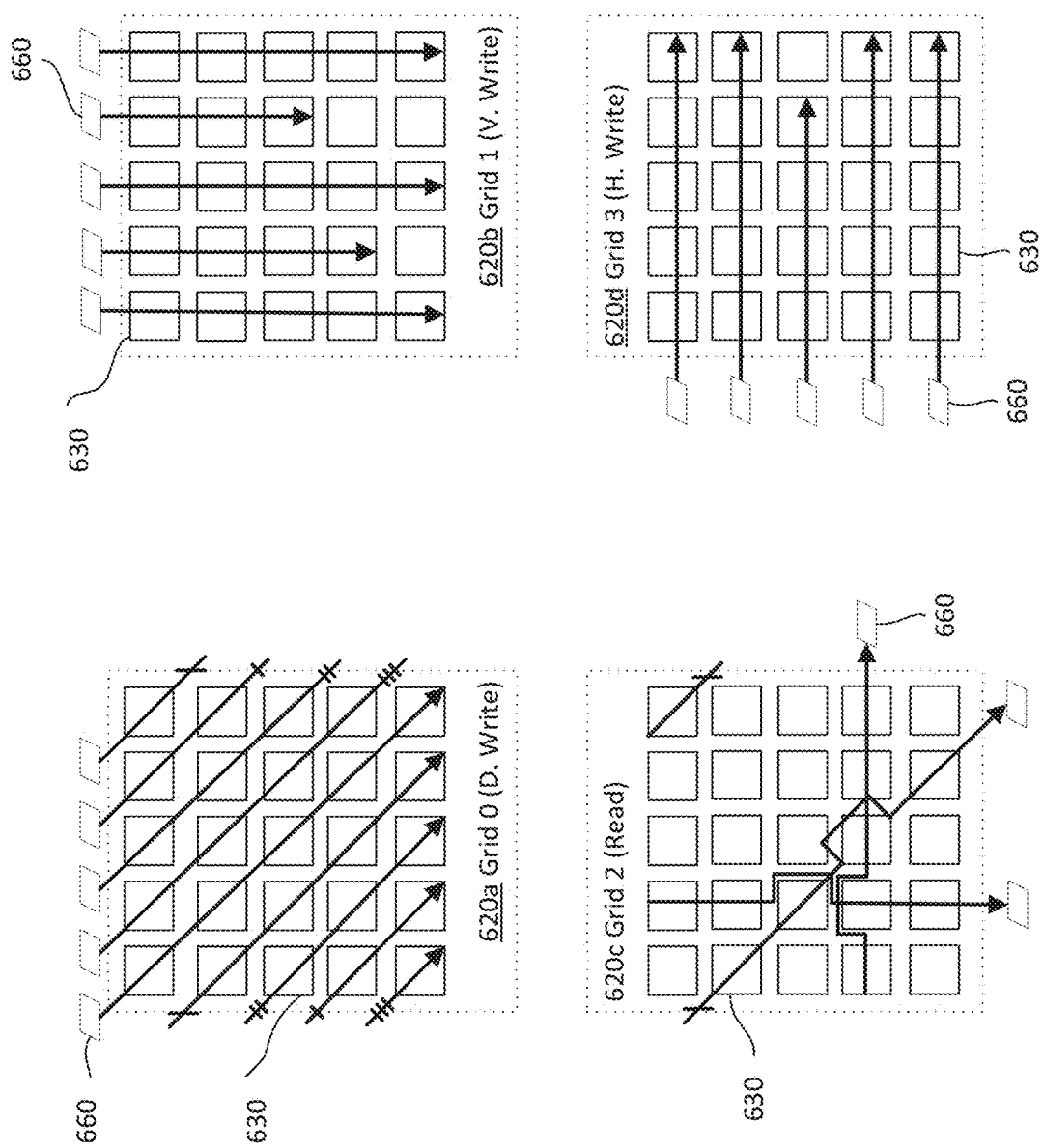
FIG. 6 illustrates an example buffer comprising four grids of memory instances in which TDUs may be stored.

As another example, FIG. 6 illustrates an example buffer 600 comprising four grids 620a-c (collectively grids 620) of memory instances 630 in which TDUs 660 may be stored, according to an embodiment. In the grids 620, horizontal logical banks are associated with a first destination, vertical logical banks are associated with a second destination, and diagonal banks are associated with a third destination. As with buffer 500 from FIG. 5, in any given clock cycle, one of the grids 620 is selected for read operations. For example, in the depicted clock cycle, grid 620c is selected.

One horizontal read operation, one vertical read operation, and one diagonal read operation from the selected grid are guaranteed each clock cycle, meaning that each destination is guaranteed a TDU to read each clock cycle, assuming one is available in the selected grid. The three reads in different directions are guaranteed on account of the logical banks in each of the directions being parity banks, meaning that each logical bank may skip reading of one overlapping memory instance 630, whose contents are then recovered using the parity-based techniques described herein.

Each of the remaining grids 620 are reserved for write operations in a different direction. Specifically, grid 620a is reserved for up to five diagonal writes, grid 620b is reserved for up to five vertical writes, and grid 620d is reserved for up to five horizontal writes. As with FIG. 5, the reserved purpose of a grid 620 changes from clock cycle to clock cycle, such that a grid 620 may be read from in one clock cycle and written to in the next. Any suitable mechanism may be utilized to determine which grid is reserved for which purpose in a given clock cycle, such as described above with respect to FIG. 5. Moreover, as in FIG. 5, buffer management logic may optionally schedule additional access operations in a clock cycle if memory accesses are still available after all possible reserved operations have been scheduled.

FIGS. 5 and 6 are but a couple examples of multi-grid embodiments. Other embodiments may include fewer or additional grids, with varying numbers of memory instances. Different numbers of grids may be reserved for read and write operations, respectively. For instance, in FIG. 6, there may be five grids, with two grids reserved for read operations. In some embodiments, logical bank directions need not be limited to any particular destination or other data attribute.

In an embodiment, rather than attempting to read from all directions in a single memory access period, a greater number of reads may be possible if all reads in a grid are in a same direction in a given memory access period (with, optionally, one additional read in another direction, depending on the embodiment). The read direction may be alternated depending on the memory access period, or multiple grids may be reserved for reads, each in a different direction, if needed. If consistent output to a downstream component is a concern, a small cache may be utilized to evenly distribute the amount of data outputted per destination in a memory access period.

In an embodiment, in some memory access periods, a read operation in one direction may be selected from one grid, while a read operation in another direction may be selected from another grid. In such cases, one or both of the grids may be scheduled for write operations in the same direction as the read operation, though fewer write operations could be guaranteed in the memory access period.

Note that buffers 500 and 600 are, in some embodiments, examples of buffer 210. In other embodiments, buffers 500 and 600 may be utilized without the specific details of FIG. 2.

2.7. Multi-Port Embodiments

The buffering techniques described thus far have been primarily described with respect to single-port embodiments. However, similar principles may be utilized in dual-port or other multi-port embodiments. That is to say, the use of memory instances shared between logical banks in two or three directions may easily be extended to multi-port memory instances, so as to increase the number of possible access operations in a given memory access period. The main difference between such embodiments is simply the number of times a shared memory instance may be read before the shared memory instance becomes inaccessible to other readers, and before those readers need to revert to a parity operation. A consequence of this difference, however, is that many additional arrangements of operations are possible in a given memory access period.

For example, in grid 620b, a dual port embodiment would allow for at least ten write operations per write grid, five of which could be in a second direction (e.g. horizontal). Or, the grid 620d may be guaranteed five write operations in a same direction and five read operations in a same direction, along with one more read operation in yet another direction. In grid 630c, there may be two guaranteed reads in each direction. Of course, more complicated arrangements of read operations, involving more than three logical banks are also possible.

2.8. Non-Parity-Based Embodiments

In some embodiments, a grid of horizontal, vertical, and/or diagonal logical banks may share memory instances without any parity data. Such embodiments may associate the directions with different attributes or functions of the data, thereby allowing buffer sharing between these attributes or functions. Generally, such a grid may only be accessed (for reading and/or writing) in one direction each clock cycle, though accessing the grid in multiple directions would be possible for TDUs smaller than the width of the logical banks. In an embodiment, the direction of a grid alternates between clock cycles, though more complicated demand-based schedules are also possible. Multiple grids may exist, and each one may potentially be assigned to a different direction in a given clock cycle.

3.0. Functional Overview

Described in this section are various example method flows for implementing various features of the systems and system components described herein. The example method flows are non-exhaustive. Alternative method flows and flows for implementing other features will be apparent from the disclosure.

The various elements of the process flows described below may be performed in a variety of systems, including in a device 1300 that utilizes some or all of the buffering mechanisms described with respect to FIGS. 2-6. In an embodiment, each of the processes described in connection with the functional blocks described below may be implemented using one or more integrated circuits, logic components, computer programs, other software elements, and/or digital logic in any of a general-purpose computer or a special-purpose computer, while performing data retrieval, transformation, and storage operations that involve interacting with and transforming the physical state of memory of the computer.

3.1. Writing a TDU

Figure 7:
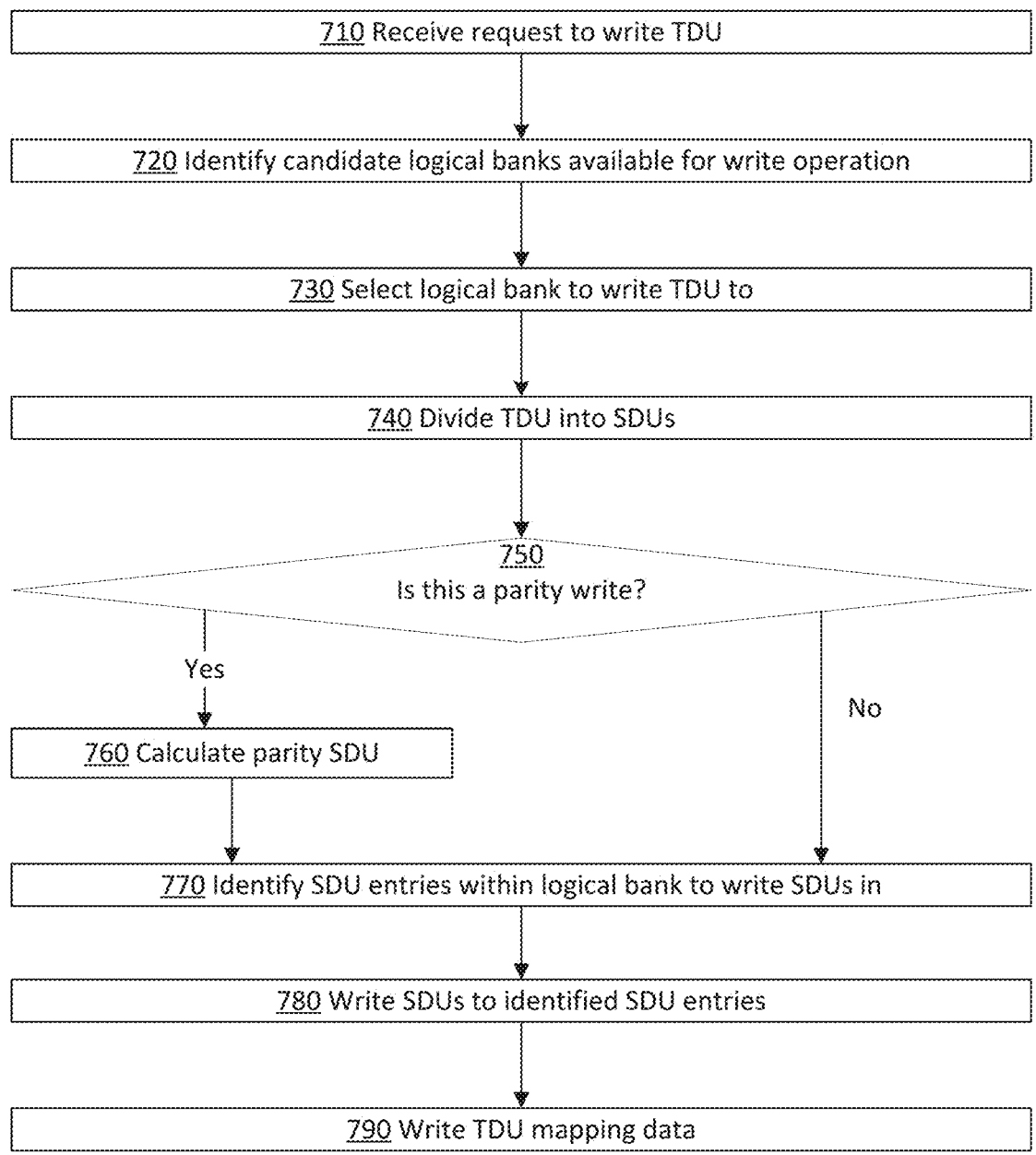
FIG. 7 illustrates an example process flow for writing a TDU at a buffering component.

FIG. 7 illustrates an example process flow 700 for writing a TDU at a buffering component, according to an embodiment. Flow 700 may be performed, for instance, by buffer management logic within or coupled to any component of a computing device that may need to buffer TDUs, including without limitation a buffer manager and/or other logic within a traffic manager of a network device.

Block 710 comprises receiving a request to write a TDU, such as a TDU 160. The request may include, or link to, the contents of the TDU, along with various optional metadata, such as a source and/or destination of the TDU, a priority of the TDU, a traffic flow associated with the TDU, a TDU identifier, and so forth.

Block 720 comprises identifying candidate logical banks that are available for a write operation in an upcoming memory access period. The upcoming memory access period may be the next memory access period after the write request was received, or the write request may be cached for some time before being scheduled for a write operation. The logical banks from which the candidate logical banks may be selected may include multiple directions of logical banks, including horizontal, vertical, and diagonal logical banks, as described in previous sections. Each logical bank includes two or more memory instances.

Depending on the embodiment, the pool of candidate logical banks may be identified via various selection steps. For example, logical banks that do not have enough room to store the TDU may be removed from the pool. In embodiments where logical bank directions are associated with some attribute of the TDU, those directions that are not associated with the same attribute as the TDU (e.g. not associated with the same destination) may be removed from the pool.

In embodiments involving multiple grids, where each grid may be associated with a different write direction in the upcoming memory access period, the pool of candidate logical banks may be reduced to those logical banks that are in the grid assigned to the same write direction as the TDU in the upcoming access period. Moreover, if other operations are already scheduled for the upcoming access period, any logical bank that is already inaccessible as a result of the scheduled operations (e.g. because the logical bank is already being fully read or written to) may be removed from the pool.

Block 730 comprises selecting which of the candidate logical banks to write the TDU to. Any assignment mechanism may be utilized to select the bank, such as a round-robin mechanism, a random or pseudo-random mechanism, a probabilistic mechanism, a fill-level-based mechanism, and so forth. In some embodiments it may be preferable that the assignment mechanism load-balance amongst the logical banks. For a smaller TDU, the selection logic may further be based on whether there is already another operation scheduled for a logical bank that writing the new TDU may be piggy-backed upon. For instance, if there is already a write operation for a logical bank, but the write operation only involves 2 SDUs, then in a four-memory instance non-parity logical bank, another write operation that involves 2 TDUs may be scheduled along with the first operation.

In some embodiments, blocks 720 and 730 are highly interrelated. For instance, blocks 720 and 730 may be performed as part of scheduling logic that iteratively considers each logical bank that is not utilized in an upcoming access period, and attempts to match the logical bank with a suitable access operation. In an embodiment, the scheduling logic may be configured to generate a number of possible schedules of access operations, and determine a score for each schedule (e.g. a count of the number of operations performed), and select the schedule with the highest score.

Block 740 comprises dividing the TDU into SDUs. The TDU may be divided into as many SDUs as there are memory instances in the logical bank, and each SDU must be smaller than the width of the logical bank. In an embodiment, each SDU is of equal size, except potentially for the last SDU, depending on the TDU size. In some embodiments, the TDU may already be divided into SDUs.

Flow 700 branches at block 750, depending on whether the write operation is a parity operation. A write operation may be a parity write operation for various reasons, depending on the embodiment. For example, in some embodiments, a write operation is a parity write operation if the logical bank to which it is writing is oriented in a certain direction. In another embodiment, a write operation is a parity write operation if the logical bank includes an extra memory instance for storing parity SDUs. In an embodiment, any time there is an unused memory instance in a logical bank for a write operation, the write operation may be designated as a parity write operation. In yet other embodiments, all write operations are parity write operations.

If the write operation is not a parity write operation, flow 700 skips to block 770. Otherwise, flow 700 continues to block 760, which comprises calculating a parity SDU. The parity SDU may be calculated using any suitable parity operation, though in an embodiment, the parity operation is an XOR between all of the SDUs of the TDU.

Block 770 comprises identifying SDU entries within the logical bank to write the SDUs to. Each SDU, including the parity SDU, is written to a different SDU entry address in a different memory instance. In an embodiment, a list of free SDU entries in the logical bank may be utilized to locate available SDU entry addresses. Once an entry address is selected, it should be removed from the free list or otherwise made unavailable for selection by other operations. In an embodiment, if there are fewer SDUs than memory instances in the logical bank, the specific memory instances to which to write a given SDU may be selected first (or even during blocks 720 or 730), and an entry address may then be selected from each selected memory instance. The specific memory instances may be selected such that, for instance, a memory instance needed for another access operation in another direction is not used.

In an embodiment, the TDU is also or instead assigned a logical address, which may be selected from a TDU free list indicating available logical addresses. In an embodiment, the SDU entry addresses may be determined using one or more mapping functions of a logical address assigned to the TDU. The simplest function would entail choosing, in each memory instance, an SDU entry address that is the same as the logical address. In other embodiments, more complex functions may be utilized, and/or each memory instance may have a different mapping function.

In some embodiments, multiple smaller TDUs may be written to the logical bank at the same time, in which case block 750 would be performed for all of the SDUs in the multiple TDUs, with each SDU stored in a different memory instance.

In an embodiment, the assignment mechanism may be configured not to select a logical bank that is currently being read from, or to which another TDU is already scheduled for writing, in a current memory access period. In another embodiment, a logical bank may support multiple operations per access period and the assignment mechanism may therefore be configured not to select a logical bank when there are no more available I/O operations in the current access period. In some embodiments, a TDU must not be buffered in the same logical bank, grid, and/or view as the PDU's immediately preceding TDU, though in other embodiments no such restriction need be imposed. In some embodiments, logical banks may be selected based on some attribute or characteristic of the TDU or PDU, such as a source, flow identifier, or other characteristic.

Block 780 comprises writing the SDUs to the respectively identified SDU entries. Any suitable writing technique may be utilized, depending on the nature of the memory instances. Since each memory instance may be written to concurrently and independently, the writing of the SDUs may be performed concurrently in the same access period.

Block 790 comprises writing TDU mapping data. The TDU mapping data links some identifier associated with the TDU to the logical bank, memory instances, and specific SDU entry addresses therein, in which the data for the SDUs may be found. The mapping data may indicate which SDU is in which SDU entry address. A TDU may be identified by an identifier specified in the write operation, a logical address at which the buffer deems the TDU to be stored, or any other identifying information. In an embodiment, there may be a level of indirection in the mapping data. For instance, a TDU identifier may be linked to a logical address for the TDU, which may then be linked to individual SDU entry addresses.

In embodiments that use mapping functions to assign SDU entry addresses, the individual SDU entry addresses need not be specified in the mapping data.

Flow 700 illustrates but one example flow for writing a TDU in a system that employs the buffering techniques described herein. Other flows may include additional or fewer elements, in varying arrangements.

3.2. Reading a TDU

Figure 8:
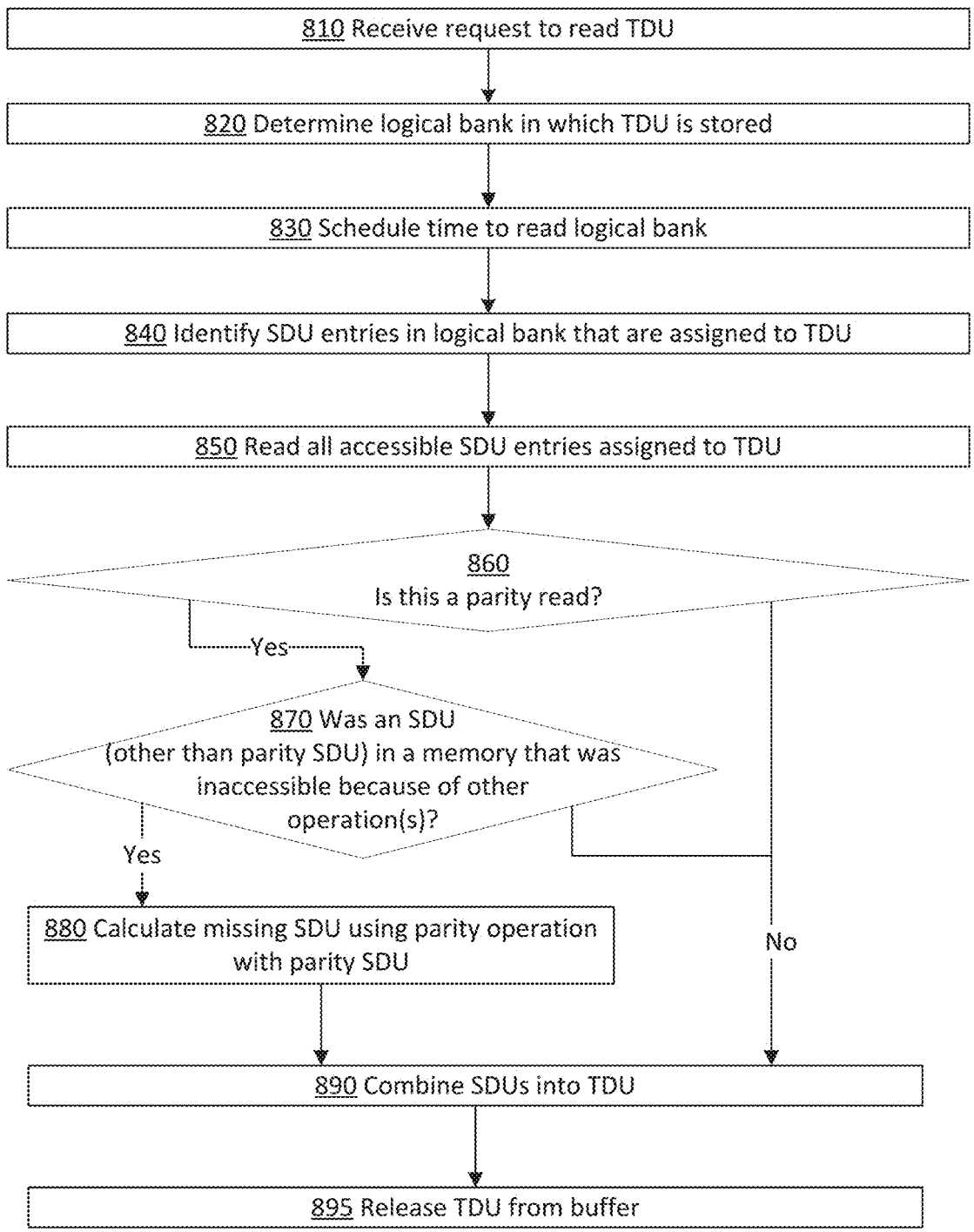
FIG. 8 illustrates an example process flow for reading a TDU at a buffering component.

FIG. 8 illustrates an example process flow 800 for reading a TDU at a buffering component, according to an embodiment. As with flow 700, flow 800 may be performed, for instance, by buffer management logic within or coupled to any component of a computing device that may need to buffer TDUs.

Block 810 comprises receiving a request to read a TDU, such as a TDU 160. The request may include a TDU identifier and/or logical address assigned to the TDU. The request may further include various optional metadata, such as a source and/or destination of the TDU, a priority of the read request, a traffic flow associated with the TDU, a TDU identifier, and so forth.

Block 820 comprises determining the logical bank in which the TDU is stored. The logical bank may be readily determinable from a logical address specified in the read request, or the logical bank may be determined using mapping data such as stored in block 790 of flow 700.

Block 830 comprises scheduling a time to read the TDU from the logical bank. In an embodiment, the scheduling may include caching the read request for some time. Scheduling logic reviews the read requests in the cache for each access period, potentially some time in advance of the access period. The scheduling logic may select some, all, or none of the read requests to execute in a given access period, depending on the embodiment and context. Examples of such scheduling logic are described in the next section and throughout the application. However, the exact mechanism by which the scheduling may occur may vary from embodiment to embodiment, and the techniques described herein may utilize any suitable scheduling mechanism.

Of course, a number of iterations of this scheduling process may pass before the read request of block 810 is finally scheduled.

Block 840 comprises identifying the SDU entries in the logical bank that are assigned to the TDU. This identifying may comprise, for instance, looking up a TDU identifier or logical address in TDU mapping data such as stored in block 790 of FIG. 7. Or this may comprise computing an SDU entry address using one or more mapping functions of the logical address. In some embodiments, block 840 may be performed before or concurrently with the scheduling of block 830, so that the specific memory instances in which data for the TDU is stored are known in advance, thereby allowing the scheduling logic to more efficiently schedule operations.

Block 850 comprises, at the scheduled time, reading all accessible SDU entries assigned to the TDU. The reading of the SDU entries may be performed in any suitable manner. Because all of the memory instances may be accessed concurrently and independently in the same memory access period, each of the SDU read operations may be performed concurrently.

At block 860, flow 800 branches based on whether the TDU read operation is a parity read. In some embodiments, a TDU read operation is a parity read if it is in a parity bank. In other embodiments, a TDU read operation is a parity read if it is for a TDU for which a parity SDU is stored. In yet other embodiments, all read operations are parity read operations. If the TDU read operation is not a parity read operation, flow 800 branches to block 890. Otherwise, flow 800 branches to block 870.

In some cases, a memory instance in which an SDU entry for the TDU is stored may be inaccessible on account of being accessed by another operation in the access period. Reading of the memory instance is skipped, meaning that the SDU stored for the TDU therein is missing. If the missing SDU is an original SDU of the TDU, as opposed to the parity SDU, this SDU must be recovered. In such cases, at block 870, flow 800 branches to block 880. Otherwise, flow 800 branches again to block 890.

Block 880 comprises calculating the missing SDU using a parity operation between each SDU that was read, including the parity SDU. The parity operation may be, for instance, an XOR operation. Note that, in some embodiments, the parity SDU need not be read unless the parity operation will be performed. In other embodiments, the parity SDU is always read. Block 880 then flows to block 890.

Block 890 comprises combining the SDUs that were read and/or reconstructed, minus the parity SDU, to reconstitute the TDU that was previously written to the buffer. Block 895 then comprises releasing the TDU from the buffer by, for instance, forwarding the TDU to a destination component, such as may have been identified in the read request metadata, by metadata within the TDU, or through other means.

Flow 800 illustrates but one example flow for reading a TDU in a system that employs the buffering techniques described herein. Other flows may include additional or fewer elements, in varying arrangements.

3.3. Scheduling Operations

Figure 9:
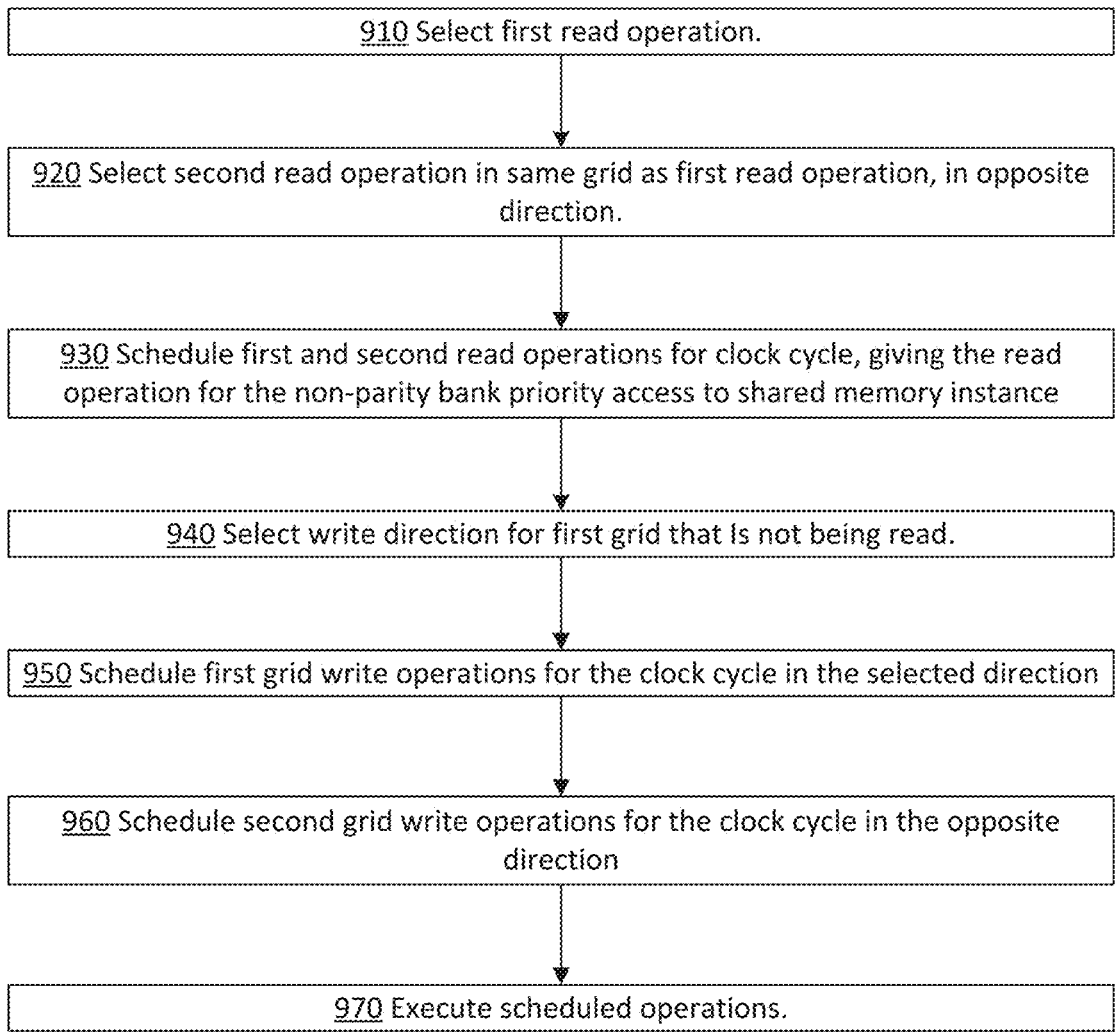
FIG. 9 illustrates an example process flow for scheduling access operations in a clock cycle.

FIG. 9 illustrates an example process flow 900 for scheduling access operations in a memory access period, according to an embodiment. Flow 900 is an example mechanism by which a read and/or write operation may be scheduled for execution in flows 700 and/or 800.

Block 910 comprises selecting a first read operation to execute in a memory access period. The selected read operation may be, for instance, an oldest read operation in a cache or queue, a highest scoring read operation in a cache or queue, a highest priority read operation, and so forth. Or, the selected read operation may be selected at random. In an embodiment, the available read operations may first be filtered by some criteria before the first read operation is selected, such as by a read direction and/or grid.

Block 920 comprises selecting a second read operation for execution in the access period. There are at least three grids of logical banks, and the second read operation is selected from the same grid as the logical bank being read in the first read operation, but in an alternate direction. The second read operation may be selected from a set of read operations meeting these criteria, using otherwise similar selection techniques as with the first read operation.

Block 930 comprises scheduling the first and second read operations for the access period. Since the first and second read operations are in different directions on the same grid, they share a common memory instance. One of the first and second read operations may be a non-parity read operation (e.g. for a non-parity bank), depending on the embodiment, in which case the non-parity read operation is scheduled first so as to be given access to this common memory instance. The other of the two operations must skip reading this memory instance.

Block 940 comprises selecting a write direction for a first grid that is not being read. The write direction may be selected at random, based on fill levels, based on historical data so as to balance selected directions for a grid over time, probabilistically, and so forth.

Block 950 comprises scheduling first grid write operations for the access period in the selected direction. Block 960 comprises scheduling write operations in the alternate direction for a second grid that is not being read in the current access period. The write operations scheduled for a particular grid may be selected at random, on a first-come-first-serve basis, based on having an associated attribute that is also associated with the selected write direction, or based on any other suitable selection mechanism.

Finally, block 970 comprises performing the scheduled operations in the selected access period. All operations are performed concurrently in the selected access period.

Flow 900 illustrates but one example flow for scheduling access operations in a system that employs the buffering techniques described herein. Other flows may include additional or fewer elements, in varying arrangements. For instance, in some embodiments there may be four grids and three access directions, in which case additional read operations and write operations would be scheduled accordingly. In some embodiments, flow 900 may include an additional step, after block 960, of searching for additional access operations that target memory instances not being accessed by any other operation in the current access period. These additional access operations may be added to the schedule as well. In yet another embodiment, some or all of the write operations may be scheduled before the read operations, and, as a consequence, the read operations are selected so as to utilize memory instances not targeted by the write operations. In another embodiment, up to a certain number of read operations are scheduled before write operations, without regards to what grid and/or direction they may target. In another embodiment, all of the read operations are scheduled only after all possible write operations have been scheduled.

More complex scheduling logic may try multiple scheduling algorithms and attempt to find an optimal schedule based thereon. Other embodiments may utilize yet other scheduling mechanisms.

4.0. Example Implementing System

Although the buffering techniques described herein may be utilized in a variety of contexts, one particular context in which the techniques provide particular advantages is in network devices. In such devices, the TDUs may be cells, frames, or other subunits of network packets. The buffer and buffer manager may be components within or coupled to traffic managers, ingress arbiters, or other components configured to buffer data units as the data units await processing by packet processors or other downstream components. The directions of the logical banks may correspond to different packet processors, traffic managers, ports or groups of ports, or other components, depending on the embodiment.

Example details of such implementing systems are now described, though it will be appreciated that the buffering techniques described herein are also useful in systems other than those described below.

4.1. Networks

A computer network is a set of computing components interconnected by communication links. Each computing component may be a separate computing device, such as, without limitation, a hub, switch, bridge, router, server, gateway, or personal computer, or a component thereof. Each computing component, or "network device," is considered to be a node within the network. A communication link is a mechanism of connecting at least two nodes such that each node may transmit data to and receive data from the other node. Such data may be transmitted in the form of signals over transmission media such as, without limitation, electrical cables, optical cables, or wireless media.

The structure and transmission of data between nodes is governed by a number of different protocols. There may be multiple layers of protocols, typically beginning with a lowest layer, such as a "physical" layer that governs the transmission and reception of raw bit streams as signals over a transmission medium. Each layer defines a data unit (the protocol data unit, or "PDU"), with multiple data units at one layer typically combining to form a single data unit in another. Additional examples of layers may include, for instance, a data link layer in which bits defined by a physical layer are combined to form a frame or cell, a network layer in which frames or cells defined by the data link layer are combined to form a packet, and a transport layer in which packets defined by the network layer are combined to form a TCP segment or UDP datagram. The Open Systems Interconnection model of communications describes these and other layers of communications. However, other models defining other ways of layering information may also be used. The Internet protocol suite, or "TCP/IP stack," is one example of a common group of protocols that may be used together over multiple layers to communicate information. However, techniques described herein may have application to other protocols outside of the TCP/IP stack.

A given node in a network may not necessarily have a link to each other node in the network, particularly in more complex networks. For example, in wired networks, each node may only have a limited number of physical ports into which cables may be plugged in to create links. Certain "terminal" nodes—often servers or end-user devices—may only have one or a handful of ports. Other nodes, such as switches, hubs, or routers, may have a great deal more ports, and typically are used to relay information between the terminal nodes. The arrangement of nodes and links in a network is said to be the topology of the network, and is typically visualized as a network graph or tree.

A given node in the network may communicate with another node in the network by sending data units along one or more different paths through the network that lead to the other node, each path including any number of intermediate nodes. The transmission of data across a computing network typically involves sending units of data, such as packets, cells, or frames, along paths through intermediary networking devices, such as switches or routers, that direct or redirect each data unit towards a corresponding destination.

While a data unit is passing through an intermediary networking device—a period of time that is conceptualized as a "visit" or "hop"—the device may perform any of a variety of actions, or processing steps, with the data unit. The exact set of actions taken will depend on a variety of characteristics of the data unit, such as metadata found in the header of the data unit, and in many cases the context or state of the network device. For example, address information specified by or otherwise associated with the data unit, such as a source address, destination address, or path information, is typically used to determine how to handle a data unit (i.e. what actions to take with respect to the data unit). For instance, an Internet Protocol ("IP") data packet may include a destination IP address field within the header of the IP data packet, based upon which a network device may determine one or more other networking devices, among a number of possible other networking devices, to forward the IP data packet to.

Figure 10:
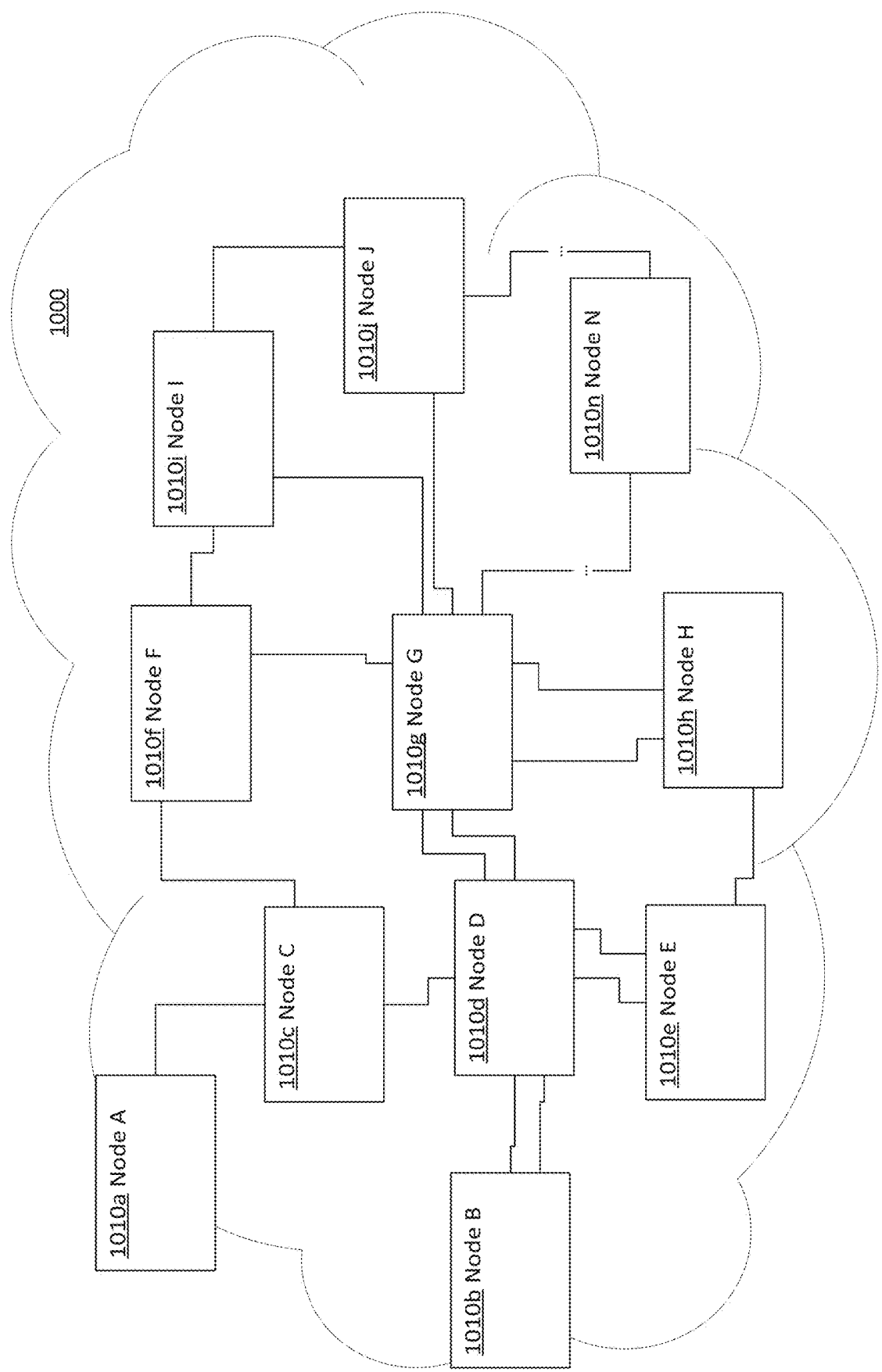
FIG. 10 is an illustrative view of various aspects of an example networking system in which the techniques described herein may be practiced.

FIG. 10 is an illustrative view of various aspects of an example networking system 1000, also referred to as a network, in which the techniques described herein may be practiced, according to an embodiment. Networking system 1000 comprises a plurality of interconnected nodes 1010a-110n (collectively nodes 1010), each implemented by a different computing device. For example, a node 1010 may be a single networking computing device, such as a router or switch, in which some or all of the processing components described herein are implemented in application-specific integrated circuits (ASICs), field programmable gate arrays (FPGAs), or other integrated circuit(s). As another example, a node 1010 may include one or more memories storing instructions for implementing various components described herein, one or more hardware processors configured to execute the instructions stored in the one or more memories, and various data repositories in the one or more memories for storing data structures utilized and manipulated by the various components.

Each node 1010 is connected to one or more other nodes 1010 in network 1000 by one or more communication links, depicted as lines between nodes 1010. The communication links may be any suitable wired cabling or wireless links. Note that system 1000 illustrates only one of many possible arrangements of nodes within a network. Other networks may include fewer or additional nodes 1010 having any number of links between them.

4.2. Data Units

While each node 1010 may or may not have a variety of other functions, in an embodiment, each node 1010 is configured to send, receive, and/or relay data to one or more other nodes 1010 via these links. In general, data is communicated as series of discrete units or structures of data represented by signals transmitted over the communication links.

Different nodes 1010 within a network 1000 may send, receive, and/or relay data units at different communication levels, or layers. For instance, a first node 1010 may send a unit of data at the network layer (e.g. a TCP segment) to a second node 1010 over a path that includes an intermediate node 1010. This unit of data will be broken into smaller units of data at various sublevels before it is transmitted from the first node 1010. These smaller data units may be referred to as "subunits" or "portions" of the larger data unit.

For example, a TCP segment may be broken into packets, then cells, and eventually sent out as a collection of signal-encoded bits to the intermediate device. Depending on the network type and/or the device type of the intermediate node 1010, the intermediate node 1010 may rebuild the entire original data unit before routing the information to the second node 1010, or the intermediate node 1010 may simply rebuild certain subunits of data (e.g. frames and/or cells) and route those subunits to the second node 1010 without ever composing the entire original data unit.

When a node 1010 receives a unit of data, it typically examines addressing information within the unit of data (and/or other information within the unit of data) to determine how to process the unit. The addressing information may be, for instance, an Internet Protocol (IP) address, MPLS label, or any other suitable information. If the addressing information indicates that the receiving node 1010 is not the destination for the data unit, the receiving node 1010 may look up the destination node 1010 within receiving node's routing information and route the data unit to another node 1010 connected to the receiving node 1010 based on forwarding instructions associated with the destination node 1010 (or an address group to which the destination node belongs). The forwarding instructions may indicate, for instance, an outgoing port over which to send the unit of data, a label to attach the unit of data, etc. In cases where multiple paths to the destination node 1010 are possible, the forwarding instructions may include information indicating a suitable approach for selecting one of those paths, or a path deemed to be the best path may already be defined.

Addressing information, flags, labels, and other metadata used for determining how to handle a data unit are typically embedded within a portion of the data unit known as the header. The header is typically at the beginning of the data unit, and is followed by the payload of the data unit, which is the information actually being sent in the data unit. A header is typically comprised of fields of different types, such as a destination address field, source address field, destination port field, source port field, and so forth. In some protocols, the number and the arrangement of fields may be fixed. Other protocols allow for arbitrary numbers of fields, with some or all of the fields being preceded by type information that explains to a node the meaning of the field.

A traffic flow is a sequence of data units, such as packets, from a source computer to a destination. In an embodiment, the source of the traffic flow may mark each data unit in the sequence as a member of the flow using a label, tag, or other suitable identifier within the data unit. In another embodiment, the flow is identified by deriving an identifier from other fields in the data unit (e.g. a "five-tuple" combination of a source address, source port, destination address, destination port, and protocol). A flow is often intended to be sent in sequence, and network devices are therefore typically configured to send all data units within a given flow along a same path to ensure that the flow is received in sequence.

Figure 12:
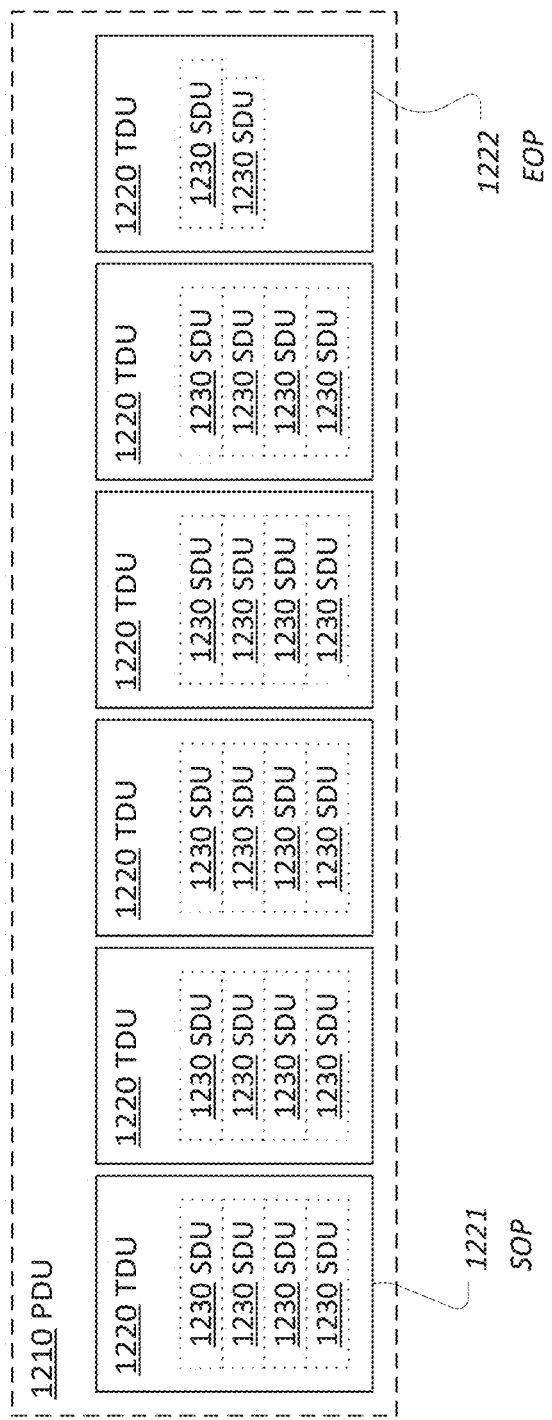

A node 1010 may operate on network data at several different layers, and therefore view the same data as belonging to several different types of data units. FIG. 12 illustrates different levels of data units that a network node may act upon or with respect to, according to an embodiment.

At a higher level, a node 1010 may view data as belonging to protocol data units ("PDUs") 1210 of a certain type, such as packets or data units at any other suitable network level. The node 1010 need not necessarily ever assemble the data in a PDU 1210 together, but rather may in an embodiment act upon constituent portions of the PDU 1210, which may be linked together by identifiers, linked lists, or other suitable constructs. These portions are referred to herein as transport data units ("TDUs") 1220. For instance, if the PDU 1210 is a packet, the TDU 1220 might be one or more cells or frames. The first TDU 1220 in a PDU 1210 is referred to as the start-of-packet ("SOP") 1221, while the last TDU 1220 in the PDU 1210 is referred to as the end-of-packet ("EOP") 1222.

Generally speaking, the TDU is the largest contiguous unit of data that certain internal components of a node 1010 are configured to communicate between each other in a given period of time. For instance, a node 1010 may have a traffic manager that is capable of receiving no more than a single TDU 1220 from each interface during a single memory access period (e.g. clock cycle). Additionally, in an embodiment, the contiguous portions of data sent by each port of a node 1010 in a given period of time may be no larger than a TDU 1220. In an embodiment, each TDU 1220 is of a fixed size, except for the last TDU 1220 in a PDU 1210, which may be of a size less than the fixed size.

In some embodiments, for physical storage purposes, a TDU 1220 may further be divided into chunks referred to as storage data units ("SDUs") 1230. In an embodiment, an SDU 1230 is the largest contiguous portion of data that may be stored in a physical buffer entry. In other words, the maximum size of an SDU 1230 is the same as the maximum size of a physical buffer entry. In an embodiment, the maximum number of SDUs 1230 in a TDU 1220 is fixed. However, an EOP TDU 1222 may have less than this number of SDUs 1230. Moreover, the last SDU 1230 in a TDU 1220 (e.g. the EOP TDU 1222) may be smaller than maximum SDU size.

In an embodiment, TDU and SDU boundaries may be relative to the component acting upon the data. That is, for example, a node 1010 whose traffic manager is configured to use TDUs of a first size and SDUs of a second size may further include other components configured to communicate or buffer data units of sizes other than the first size and the second size.

For convenience, many of the techniques described in this disclosure are described with respect to embodiments where the PDUs are IP packets in a L3 (level 3) network, and the TDUs are the constituent cells and frames thereof in an L2 (level 2) network, in which contexts the described techniques have particular advantages. It will be recognized, however, that these techniques may also be applied to realize advantages in routing other types of data units conforming to other protocols and/or at other communication layers within a network. Thus, unless otherwise stated or apparent, the techniques described herein should also be understood to apply to contexts in which the PDUs, TDUs, and SDUs are of any other types of data structures communicated across a network, such as segments or datagrams. That is, in these contexts, other types of data structures may be used in place of packets, cells, frames, and so forth.

4.3. Network Paths

Any node in the depicted network 1000 may communicate with any other node in the network 1000 by sending data units through a series of nodes 1010 and links, referred to as a path. For example, Node B (1010*b*) may send data units to Node H (1010*h*) via a path from Node B to Node D to Node E to Node H. There may be a large number of valid paths between two nodes. For example, another path from Node B to Node H is from Node B to Node D to Node G to Node H.

In an embodiment, a node 1010 does not actually need to specify a full path for a data unit that it sends. Rather, the node 1010 may simply be configured to calculate the best path for the data unit out of the device (e.g. which egress port it should send the data unit out on). When a node 1010 receives a data unit that is not addressed directly to the node 1010, based on header information associated with a data unit, such as path and/or destination information, the node 1010 relays the data unit along to either the destination node 1010, or a "next hop" node 1010 that the node 1010 calculates is in a better position to relay the data unit to the destination node 1010. In this manner, the actual path of a data unit is product of each node 1010 along the path making routing decisions about how best to move the data unit along to the destination node 1010 identified by the data unit.

4.4. Network Device

Figure 11:
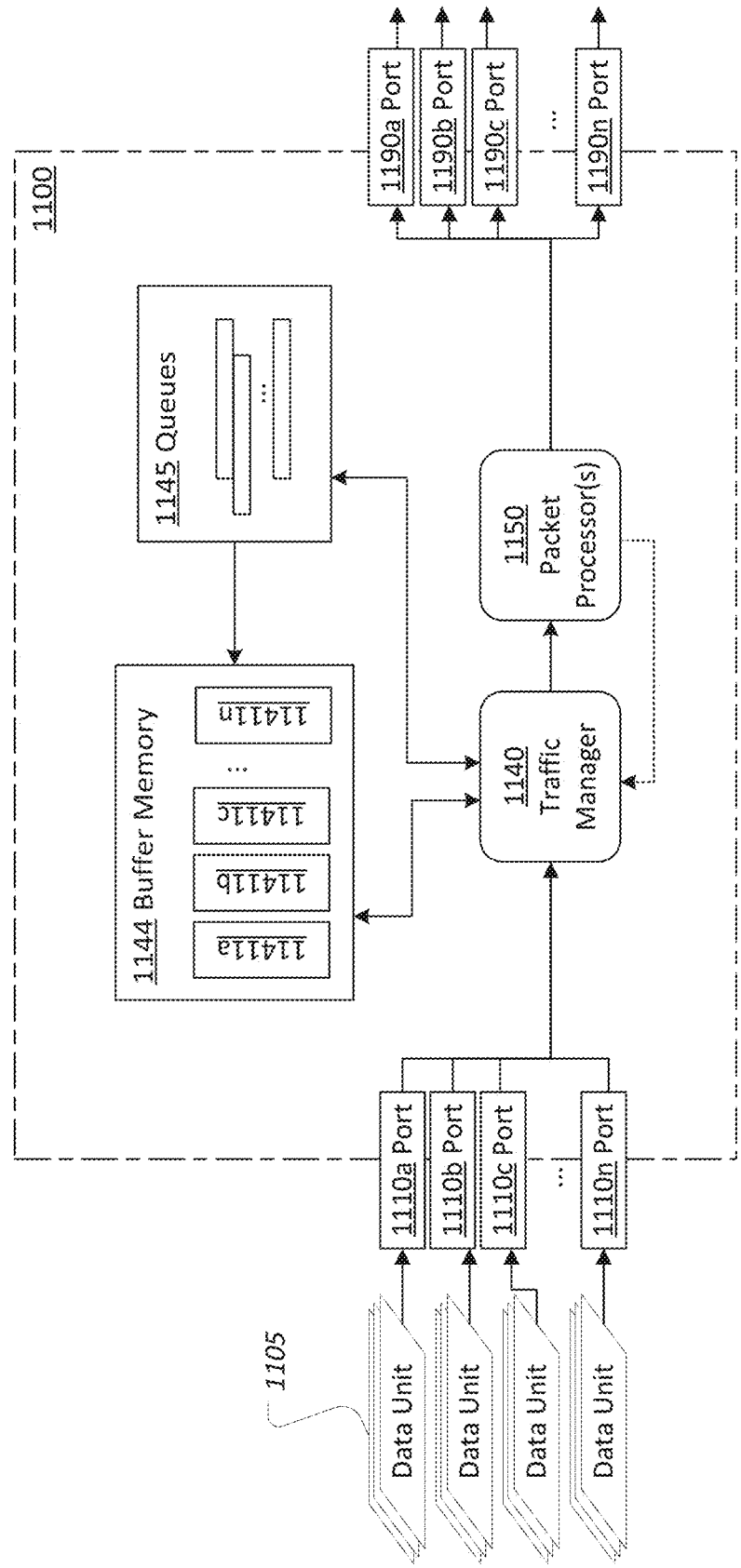
FIG. 11 is an illustrative view of various aspects of an example network device in which techniques described herein may be practiced.

FIG. 11 is an illustrative view of various aspects of an example network device 1100 in which techniques described herein may be practiced, according to an embodiment. Network device 1100 is a computing device comprising any combination of hardware and software configured to implement the various logical components described herein, including components 1110-1190. For example, the apparatus may be a single networking computing device, such as a router or switch, in which some or all of the components 1110-1190 described herein are implemented using application-specific integrated circuits (ASICs) or field programmable gate arrays (FPGAs). As another example, an implementing apparatus may include one or more memories storing instructions for implementing various components described herein, one or more hardware processors configured to execute the instructions stored in the one or more memories, and various data repositories in the one or more memories for storing data structures utilized and manipulated by various components 1110-1190.

Device 1100 is generally configured to receive and forward data units 1105 to other devices in a network, such as network 1000, by means of a series of operations performed at various components within the device 1100. Note that, in an embodiment, some or all of the nodes 1010 in system such as network 1000 may each be or include a separate network device 1100. In an embodiment, a node 1010 may include more than one device 1100. In an embodiment, device 1100 may itself be one of a number of components within a node 1010. For instance, network device 1100 may be an integrated circuit, or "chip," dedicated to performing switching and/or routing functions within a network switch or router. The network switch or router may further comprise one or more central processor units, storage units, memories, physical interfaces, LED displays, or other components external to the chip, some or all of which may communicate with the chip.

A non-limiting example flow of a data unit 1105 through various subcomponents of the forwarding logic of device 1100 is as follows. After being received via a port 1110, a data unit 1105 may be buffered by an arbiter until the data unit 1105 can be processed by an ingress packet processor 1150, and then delivered to an interconnect. From the interconnect, the data unit 1105 may be forwarded to a traffic manager 1140. The traffic manager 1140 may store the data unit 1105 in a buffer 1144 and assign the data unit 1105 to a queue 1145. The traffic manager 1140 manages the flow of the data unit 1105 through the queue 1145 until the data unit 1105 is released to an egress packet processor 1150. Depending on the processing, the traffic manager 1140 may then assign the data unit 1105 to another queue so that it may be processed by yet another egress processor 1150, or the egress packet processor 1150 may send the data unit 1105 to an egress arbiter from which the data unit 1105 is finally forwarded out another port 1190. Of course, depending on the embodiment, the forwarding logic may omit some of these subcomponents and/or include other subcomponents in varying arrangements.

Example components of a device 1100 are now described in further detail.

4.5. Ports

Network device 1100 includes ports 1110/1190. Ports 1110, including ports 1110*a-n*, are inbound ("ingress") ports by which data units referred to herein as data units 1105 are received over a network, such as network 1000. Ports 1190, including ports 1190*a-n*, are outbound ("egress") ports by which at least some of the data units 1105 are sent out to other destinations within the network, after having been processed by the network device 1100.

Data units 1105 may be of any suitable PDU type, such as packets, cells, frames, etc. In an embodiment, data units 1105 are packets. However, the individual atomic data units upon which the depicted components may operate may be actually be subunits of the data units 1105, such as the previously depicted TDU 1220. For example, data units 1105 may be received, acted upon, and transmitted at a cell or frame level. These cells or frames may be logically linked together as the data units 1105 (e.g. packets) to which they respectively belong for purposes of determining how to handle the cells or frames. However, the subunits may not actually be assembled into data units 1105 within device 1100, particularly if the subunits are being forwarded to another destination through device 1100.

Ports 1110/1190 are depicted as separate ports for illustrative purposes, but may actually correspond to the same physical hardware ports (e.g. network jacks or interfaces) on the network device 1110. That is, a network device 1100 may both receive data units 1105 and send data units 1105 over a single physical port, and the single physical port may thus function as both an ingress port 1110 and egress port 1190. Nonetheless, for various functional purposes, certain logic of the network device 1100 may view a single physical port as a separate ingress port 1110 and egress port 1190. Moreover, for various functional purposes, certain logic of the network device 1100 may subdivide a single physical ingress port or egress port into multiple ingress ports 1110 or egress ports 1190, or aggregate multiple physical ingress ports or egress ports into a single ingress port 1110 or egress port 1190. Hence, in various embodiments, ports 1110 and 1190 should be understood as distinct logical constructs that are mapped to physical ports rather than simply as distinct physical constructs.

In some embodiments, the ports 1110/1190 of a device 1100 may be coupled to one or more transceivers, such as Serializer/Deserializer ("SerDes") blocks. For instance, ports 1110 may provide parallel inputs of received data units into a SerDes block, which then outputs the data units serially into an ingress packet processor 1150. On the other end, an egress packet processor 1150 may input data units serially into another SerDes block, which outputs the data units in parallel to ports 1190.

4.6. Packet Processors

A device 1100 comprises one or more packet processing components 1150 that collectively implement forwarding logic by which the device 1100 is configured to determine how to handle each data unit 1105 that the device 1100 receives. These packet processors 1150 may be any suitable combination of fixed circuitry and/or software-based logic, such as specific logic components implemented by one or more Field Programmable Gate Arrays (FPGAs) or Application-Specific Integrated Circuits (ASICs), or a general-purpose processor executing software instructions.

Different packet processors 1150 may be configured to perform different packet processing tasks. These tasks may include, for example, identifying paths along which to forward data units 1105, forwarding data units 1105 to egress ports 1190, implementing flow control and/or other policies, manipulating packets, performing statistical or debugging operations, and so forth. A device 1100 may comprise any number of packet processors 1150 configured to perform any number of processing tasks.

In an embodiment, the packet processors 1150 within a device 1100 may be arranged such that the output of one packet processor 1150 may, eventually, be inputted into another packet processor 1150, in such a manner as to pass data units 1105 from certain packet processor(s) 1150 to other packet processor(s) 1150 in a sequence of stages, until finally disposing of the data units 1105 (e.g. by sending the data units 1105 out an egress port 1190, "dropping" the data units 1105, etc.). The exact set and/or sequence of packet processors 1150 that process a given data unit 1105 may vary, in some embodiments, depending on the attributes of the data unit 1105 and/or the state of the device 1100. There is no limit to the number of packet processors 1150 that may be chained together in such a manner.

Based on decisions made while processing a data unit 1105, a packet processor 1150 may, in some embodiments, and/or for certain processing tasks, manipulate a data unit 1105 directly. For instance, the packet processor 1150 may add, delete, or modify information in a data unit header or payload. In other embodiments, and/or for other processing tasks, a packet processor 1150 may generate control information that accompanies the data unit 1105, or is merged with the data unit 1105, as the data unit 1105 continues through the device 1100. This control information may then be utilized by other components of the device 1100 to implement decisions made by the packet processor 1150.

In an embodiment, a packet processor 1150 need not necessarily process an entire data unit 1105, but may rather only receive and process a subunit of a data unit 1105, such as a TDU comprising header information for the data unit. For instance, if the data unit 1105 is a packet comprising multiple cells, the first cell, or a first subset of cells, might be forwarded to a packet processor 1150, while the remaining cells of the packet (and potentially the first cell(s) as well) are forwarded in parallel to a merger component where they await results of the processing.

Ingress and Egress Processors

In an embodiment, a packet processor may be generally classified as an ingress packet processor 1150 or an egress packet processor 1150. Generally, an ingress processor 1150 resolves destinations for a traffic manager 1140 to determine which ports 1190 and/or queues 1145 a data unit 1105 should depart from. There may be any number of ingress processors 1150, including just a single ingress processor 1150.

In an embodiment, an ingress processor 1150 performs certain intake tasks on data units 1105 as they arrive. These intake tasks may include, for instance, and without limitation, parsing data units 1105, performing routing related lookup operations, categorically blocking data units 1105 with certain attributes and/or when the device 1100 is in a certain state, duplicating certain types of data units 1105, making initial categorizations of data units 1105, and so forth. Once the appropriate intake task(s) have been performed, the data units 1105 are forwarded to an appropriate traffic manager 1140, to which the ingress processor 1150 may be coupled directly or via various other components, such as an interconnect component.

The egress packet processor(s) 1150 of a device 1100, by contrast, may be configured to perform non-intake tasks necessary to implement the forwarding logic of the device 1100. These tasks may include, for example, tasks such as identifying paths along which to forward the data units 1105, implementing flow control and/or other policies, manipulating data units, performing statistical or debugging operations, and so forth. In an embodiment, there may be different egress packet processors(s) 1150 assigned to different flows or other categories of traffic, such that not all data units 1105 will be processed by the same egress packet processor 1150.

In an embodiment, each egress processor 1150 is coupled to a different group of egress ports 1190 to which they may send data units 1105 processed by the egress processor 1150. In an embodiment, access to a group of ports 1190 may be regulated via an egress arbiter coupled to the egress packet processor 1150. In some embodiments, an egress processor 1150 may also or instead be coupled to other potential destinations, such as an internal central processing unit, a storage subsystem, or a traffic manager 1140.

4.7. Buffers

Since not all data units 1105 received by the device 1100 can be processed by the packet processor(s) 1150 at the same time, various components of device 1100 may temporarily store data units 1105 in a buffer 1144 while the data units 1105 are waiting to be processed. For example, a certain packet processor 1150 may only be capable of processing a certain number of data units 1105, or portions of data units 1105, in a given clock cycle, meaning that other data units 1105, or portions of data units 1105, destined for the packet processor 1150 must either be ignored (i.e. dropped) or stored. At any given time, a large number of data units 1105 may be stored in the buffers 1144 of the device 1100, depending on network traffic conditions.

A device 1100 may include a variety of buffers 1144, each utilized for varying purposes and/or components. Generally, a data unit 1105 awaiting processing by a component is held in a buffer 1144 associated with that component until the data unit 1105 is "released" to the component for processing. Some or all of the buffers 1144 may be arranged in manners described elsewhere within this application.

Each TDU stored in the buffer 1144 belongs to a PDU. However, the data for the TDUs that belong to a PDU may not necessarily be stored adjacent to each other. If one wishes to reconstruct a PDU based on the buffered SDUs, one might be unable to do so using the TDU buffer memory alone. Therefore, in an embodiment, buffer 1144 may further store or be associated with linking data that indicates which TDUs belong to a given PDU, also referred to as intra-packet link data.

For each PDU, buffer space 1144 may further store or be associated with various PDU metadata. The PDU metadata may include any suitable information about a PDU, such as a PDU identifier, location(s) of linking data for the PDU (e.g. the address(es) of intra-packet entr(ies) at which the linked list(s) for the PDU start), a count of TDUs in the PDU, source information, destination information, control information, timestamps, statistics, an assigned queue, flow control information, and so forth.

4.8. Queues

In an embodiment, to manage the order in which data units 1105 are processed from buffers, various components of a device 1100 may implement queueing logic. For example, the flow of data units through ingress buffers may be managed using ingress queues while the flow of data units through egress buffers may be managed using egress queues.

Each data unit 1105, or the buffer locations(s) in which the data unit 1105 is stored, is said to belong to one or more constructs referred to as queues 1145. Typically, a queue 1145 is a set of memory locations (i.e. in the buffers) arranged in some order by metadata describing the queue 1145. The memory locations may (and often are) non-contiguous relative to their addressing scheme and/or physical arrangement. For example, the metadata for one queue 1145 may indicate that the queue 1145 is comprised of, in order, entry addresses 2, 50, 3, and 82 in a certain buffer.

In many embodiments, the sequence in which the queue 1145 arranges its constituent data units 1105 generally corresponds to the order in which the data units 1105 or data unit portions in the queue 1145 will be released and processed. Such queues 1145 are known as first-in-first-out ("FIFO") queues, though in other embodiments other types of queues may be utilized. In some embodiments, the number of data units 1105 or data unit portions assigned to a given queue 1145 at a given time may be limited, either globally or on a per-queue basis, and this limit may change over time.

4.9. Traffic Management

According to an embodiment, a device 1100 further includes one or more traffic managers 1140 configured to control the flow of data units 1105 to one or more packet processor(s) 1150. A traffic manager 1140 may receive data units 1105 directly from a port 1110, from an ingress processor 1150, and/or other suitable components of device 1100. In an embodiment, the traffic manager 1140 receives one TDU from each possible source (e.g. each port 1110) each clock cycle or other time slot.

Traffic manager 1140 may include or be coupled to buffers 1144 for buffering data units 1105 prior to sending those data units 1105 to their respective processor(s) 1150. A buffer manager within the traffic manager 1140 may temporarily store data units 1105 in buffers 1144 as they await processing by processor(s) 1150. A data unit 1105 or data unit portion in a buffer 1144 may eventually be "released" to one or more processor(s) 1150 for processing, by reading the data unit 1105 from the buffer 1144 and sending the data unit 1105 to the processor(s) 1150. In an embodiment, traffic manager 1140 may release up to a certain number of data units 1105 from buffers 1144 to processors 1150 each clock cycle or other defined time slot.

Beyond managing the use of buffers 1144 to store data units 1105 (or copies thereof), a traffic manager 1140 may include queue management logic configured to assign data units 1105 to queues 1145 and manage the flow of data units 1105 through the queues 1145. The traffic manager 1140 may, for instance, "enqueue" a PDU that has been fully buffered by identifying a specific queue 1145 to assign the PDU to, and then linking a PDU identifier or other PDU metadata to the assigned queue. The traffic manager 1140 may further determine when to release—also referred to as "dequeuing"—data units 1105 from queues 1145 by sending instructions to the buffer manager 1144 read/release the data units 1105 and then providing the data read from the buffer 1144 to specific packet processor(s) 1150.

In an embodiment, different queues 1145 may exist for different sources or destinations. For example, each port 1110 and/or port 1190 may have its own set of queues 1145. The queue 1145 to which an incoming data unit 1105 is assigned and linked may, for instance, be selected based on forwarding information indicating which port 1190 the data unit 1105 should depart from. In an embodiment, a different egress processor 1150 may be associated with each different set of one or more queues 1145. In an embodiment, the current processing context of the data unit 1105 may be used to select which queue 1145 a data unit 1105 should be assigned to.

In an embodiment, there may also or instead be different queues 1145 for different flows or sets of flows. That is, each identifiable traffic flow or group of traffic flows is assigned its own set of queues 1145 to which its data units 1105 are respectively assigned. In an embodiment, different queues 1145 may correspond to different classes of traffic or quality-of-service (QoS) levels. Different queues 1145 may also or instead exist for any other suitable distinguishing properties of the data units 1105, such as source address, destination address, packet type, and so forth.

Though only one packet processor 1150 and traffic manager 1140 are depicted, a device 1100 may comprise any number of packet processors 1150 and traffic managers 1140. For instance, different sets of ports 1110 and/or ports 1190 may have their own traffic manager 1140 and packet processors 1150. As another example, in an embodiment, the traffic manager 1140 may be duplicated for some or all of the stages of processing a data unit. For example, system 1100 may include a traffic manager 1140 and egress packet processor 1150 for an egress stage performed upon the data unit 1105 exiting the system 1100, and/or a traffic manager 1140 and packet processor 1150 for any number of intermediate stages. The data unit 1105 may thus pass through any number of traffic managers 1140 and/or packet processors 1150 prior to exiting the system 1100. In other embodiments, only a single traffic manager 1140 is needed. If intermediate processing is needed, flow of a data unit 1105 may "loop back" to the traffic manager 1140 for buffering and/or queuing after each stage of intermediate processing.

In an embodiment, a traffic manager 1140 is coupled to the ingress packet processor(s) 1150, such that data units 1105 (or portions thereof) are assigned to buffers 1144 only upon being initially processed by an ingress packet processor 1150. Once in an egress buffer 1144, a data unit 1105 (or portion thereof) may be "released" to one or more egress packet processor(s) 1150 for processing.

In the course of processing a data unit 1105, a device 1100 may replicate a data unit 1105 one or more times for purposes such as, without limitation, multicasting, mirroring, debugging, and so forth. For example, a single data unit 1105 may be replicated to multiple egress queues 1145. For instance, a data unit 1105 may be linked to separate queues 1145 for each of ports 1, 3, and 5. As another example, a data unit 1105 may be replicated a number of times after it reaches the head of a queue 1145 (e.g. for different egress processors 1150). Hence, though certain techniques described herein may refer to the original data unit 1105 that was received by the device 1100, it will be understood that those techniques will equally apply to copies of the data unit 1105 that have been generated for various purposes. A copy of a data unit 1105 may be partial or complete. Moreover, there may be an actual physical copy of the data unit 1105 in buffers 1144, or a single copy of the data unit 1105 may be linked from a single buffer location to multiple queues 1145 at the same time.

4.10. Forwarding Logic

The logic by which a device 1100 determines how to handle a data unit 1105—such as where and whether to send a data unit 1105, whether to perform additional processing on a data unit 1105, etc. —is referred to as the forwarding logic of the device 1100. This forwarding logic is collectively implemented by a variety of the components of the device 1100, such as described above. For example, an ingress packet processor 1150 may be responsible for resolving the destination of a data unit 1105 and determining the set of actions/edits to perform on the data unit 1105, and an egress packet processor 1150 may perform the edits. Or, the egress packet processor 1150 may also determine actions and resolve a destination in some cases. Also, there may be embodiments when the ingress packet processor 1150 performs edits as well.

The forwarding logic may be hard-coded and/or configurable, depending on the embodiment. For example, the forwarding logic of a device 1100, or portions thereof, may, in some instances, be at least partially hard-coded into one or more ingress processors 1150 and/or egress processors 1150. As another example, the forwarding logic, or elements thereof, may also be configurable, in that the logic changes over time in response to analyses of state information collected from, or instructions received from, the various components of the device 1100 and/or other nodes in the network in which the device 1100 is located.

In an embodiment, a device 1100 will typically store in its memories one or more forwarding tables (or equivalent structures) that map certain data unit attributes or characteristics to actions to be taken with respect to data units 1105 having those attributes or characteristics, such as sending a data unit 1105 to a selected path, or processing the data unit 1105 using a specified internal component. For instance, such attributes or characteristics may include a Quality-of-Service level specified by the data unit 1105 or associated with another characteristic of the data unit 1105, a flow control group, an ingress port 1110 through which the data unit 1105 was received, a tag or label in a packet's header, a source address, a destination address, a packet type, or any other suitable distinguishing property. A traffic manager 1140 may, for example, implement logic that reads such a table, determines one or more ports 1190 to send a data unit 1105 to base on the table, and sends the data unit 1105 to an egress processor 1150 that is coupled to the one or more ports 1190.

According to an embodiment, the forwarding tables describe groups of one or more addresses, such as subnets of IPv4 or IPv6 addresses. Each address is an address of a network device on a network, though a network device may have more than one address. Each group is associated with a potentially different set of one or more actions to execute with respect to data units that resolve to (e.g. are directed to) an address within the group. Any suitable set of one or more actions may be associated with a group of addresses, including without limitation, forwarding a message to a specified "next hop," duplicating the message, changing the destination of the message, dropping the message, performing debugging or statistical operations, applying a quality of service policy or flow control policy, and so forth.

For illustrative purposes, these tables are described as "forwarding tables," though it will be recognized that the extent of the action(s) described by the tables may be much greater than simply where to forward the message. For example, in an embodiment, a table may be a basic forwarding table that simply specifies a next hop for each group. In other embodiments, a table may describe one or more complex policies for each group. Moreover, there may be different types of tables for different purposes. For instance, one table may be a basic forwarding table that is compared to the destination address of each packet, while another table may specify policies to apply to packets upon ingress based on their destination (or source) group, and so forth.

In an embodiment, forwarding logic may read port state data for ports 1110/1190. Port state data may include, for instance, flow control state information describing various traffic flows and associated traffic flow control rules or policies, link status information indicating links that are up or down, port utilization information indicating how ports are being utilized (e.g. utilization percentages, utilization states, etc.). Forwarding logic may be configured to implement the associated rules or policies associated with the flow(s) to which a given packet belongs.

As data units 1105 are routed through different nodes in a network, the nodes may, on occasion, discard, fail to send, or fail to receive certain data units 1105, thus resulting in the data units 1105 failing to reach their intended destination. The act of discarding of a data unit 1105, or failing to deliver a data unit 1105, is typically referred to as "dropping" the data unit. Instances of dropping a data unit 1105, referred to herein as "drops" or "packet loss," may occur for a variety of reasons, such as resource limitations, errors, or deliberate policies. Different components of a device 1100 may make the decision to drop a data unit 1105 for various reasons. For instance, a traffic manager 1140 may determine to drop a data unit 1105 because, among other reasons, buffers 1144 are overutilized, a queue 1145 is over a certain size, and/or a data unit 1105 has a certain characteristic.

4.11. Miscellaneous

Device 1100 illustrates only one of many possible arrangements of components in a network device configured to provide the functionality described herein. Other arrangements may include fewer, additional, or different components, and the division of work between the components may vary depending on the arrangement. Moreover, in an embodiment, the techniques described herein may be utilized in a variety of computing contexts other than within a network 1000.

For simplification, the traffic managers, packet processors, and other components are on occasion described herein as acting upon or with respect to a data unit, when in fact only a portion of the data unit may be sent to or otherwise available to the component. For instance, a packet processor may be said to process a data unit, when in fact only the data unit control portion is available to the packet processor. In such contexts, it will be understood that the information about the data unit that is actually available to the component is a representation of the data unit to that component. Any actions described herein as having been taken by the component on or with respect to the data unit may occur with respect to the representation of the data unit, and not necessarily the complete data unit.

5.0. Example Embodiments

Examples of some embodiments are represented, without limitation, in the following clauses:

According to an embodiment, a network switching apparatus comprises: a plurality of memory instances that form a buffer, each of the memory instances comprising a plurality of entries configured to store storage data units ('SDU"), each of the entries configured to store a single SDU, the memory instances organized into overlapping logical banks, including horizontal logical banks and vertical logical banks; write logic configured to write transport data units ("TDUs") to the logical banks by, for each TDU of the TDUs, writing one or more SDUs into which the TDU has been divided to different entries in different memory instances of a logical bank assigned to the TDU, and, when the logical bank is one of the horizontal logical banks, calculating a parity SDU and writing the parity SDU to the logical bank; read logic configured to output the TDUs from the logical banks by, for each TDU of the TDUs, reading one or more of the SDUs into which the TDU was divided from the different memory instances of the logical bank to which the TDU was written, and, when the logical bank is a horizontal logical bank that shares a same memory instance with a vertical logical bank is being read concurrently, instead of reading a particular SDU from the shared memory instance, reconstructing the particular SDU using a particular parity SDU that was written for the TDU in another memory instance of the horizontal logical bank.

In an embodiment, the TDUs are cells or frames of network packets, the apparatus further comprising: a traffic manager coupled to the memory instances and configured to utilize the memory instances to buffer and queue the TDUs until one or more packet processors are ready to process the TDUs; and the one or more packet processors, configured to process the network packets prior to sending the network packets to destinations coupled to the network switching apparatus by one or more networks.

In an embodiment, the apparatus further comprises: buffer logic configured to receive write requests to write transport data units ("TDUs") to the buffer and to receive read requests to read the TDUs from the buffer; scheduling logic configured to schedule the write requests and the read requests for execution in particular clock cycles, the scheduling logic configured to schedule a first operation that accesses a particular horizontal logical bank concurrently, in a same clock cycle, with a second operation that accesses a particular vertical logical bank that shares a particular memory instance with the particular horizontal logical bank.

In an embodiment, the write logic is configured to generate the parity SDU for a first TDU that has been divided into first SDUs using an exclusive-or ("XOR") operation between each of the first SDUs; and the read logic is configured to reconstruct the particular SDU for the first TDU using an exclusive-or ("XOR") operation between each other of the first SDUs and the parity SDU.

In an embodiment, the horizontal logical banks and the vertical logical banks are organized into a grid, each of the horizontal logical banks sharing a memory instance with each of the vertical logical banks.

In an embodiment, each of the memory instances is a single-ported memory instance that is accessible only once per clock cycle.

In an embodiment, each of the memory instances is a dual-ported memory instance, a shared memory instance accessible twice in a clock cycle before the read logic must utilize a parity operation to reconstruct data from the shared memory instance.

In an embodiment, the memory instances are further organized into diagonal logical banks; wherein the write logic is configured to, for each TDU of the TDUs, calculate the parity SDU and write the parity SDU to the logical bank regardless of the logical bank to which the TDU is written; wherein, when concurrently reading from any two logical banks that share a same memory instance, the read logic is configured not to read a first SDU from the shared memory instance for a first TDU that was written to a particular one of the logical banks, and to instead reconstruct the first SDU using a first parity SDU that was written for the first TDU in another memory instance of the particular one of the logical banks.

In an embodiment, the apparatus further comprises scheduling logic configured to schedule the write requests and the read requests for execution in particular clock cycles; wherein the memory instances are organized into at least three separate grids of the horizontal logical banks and the vertical logical banks; wherein the scheduling logic is configured to, for a given clock, select a first grid for executing read operations, select a second grid for executing write operations on horizontal logical banks in the second grid, and select a third grid for executing write operations on vertical logical banks in the third grid, wherein the grids selected for the read operations and the write operations vary between clock cycles.

In an embodiment, the apparatus further comprises: scheduling logic configured to schedule the write requests and the read requests for execution in particular clock cycles; wherein the memory instances are organized into at least a first grid of the horizontal logical banks and the vertical logical banks; wherein the scheduling logic is configured to concurrently schedule read operations on multiple horizontal logical banks in the first grid along with a read operation or write operation on a first vertical bank in the first grid that shares a memory instance with each of the multiple horizontal logical banks.

According to an embodiment, a method comprises: receiving write requests to store TDUs in a buffer, the buffer comprising memory instances organized into overlapping horizontal logical banks and vertical logical banks; writing a first TDU in a particular vertical logical bank by dividing the first TDU into first SDUs and writing the first SDUs to different memory instances of the particular vertical logical bank, including a first particular SDU in a particular memory instance shared by the particular vertical logical bank and a particular horizontal logical bank; writing a second TDU in the particular horizontal logical bank by dividing the second TDU into second SDUs, calculating a parity SDU based on a first operation between the second SDUs, and writing the second SDUs to different memory instances of the particular horizontal logical bank, including a second particular SDU in the particular memory instance; reading the first TDU from the particular vertical logical bank by reading the first SDUs from the different memory instances to which the first SDUs were written; concurrently with reading the first TDU, reading the second TDU from the particular horizontal logical bank by reading all of the second SDUs and the parity SDU from the different memory instances to which the second SDUs and the parity SDU were written, except for the second particular SDU; reconstructing the second particular SDU based on a second operation between the parity SDU and each of the second SDUs other than the second particular SDU; and outputting the first TDU and the second TDU from the buffer.

In an embodiment, the first operation and the second operation are XOR operations.

In an embodiment, the horizontal logical banks and the vertical logical banks are organized into a grid, each of the horizontal logical banks sharing a memory instance with each of the vertical logical banks.

In an embodiment, each of the memory instances is a single-ported memory instance that is accessible only once per clock cycle.

In an embodiment, the memory instances are further organized into diagonal logical banks, the method further comprising: writing a third TDU in a particular diagonal logical bank, the first TDU and the third TDU each having an SDU stored in a first memory instance shared by the particular diagonal logical bank and the particular vertical logical bank, the second TDU and the third TDU each having an SDU stored in a second memory instance shared by the particular diagonal logical bank and the particular horizontal logical bank.

In an embodiment, the memory instances are organized into at least three separate grids of the horizontal logical banks and the vertical logical banks, the method further comprising: for a given clock cycle, selecting a first grid for executing read operations, selecting a second grid for executing write operations on horizontal logical banks in the second grid, and selecting a third grid for executing write operations on vertical logical banks in the third grid, wherein the grids selected for the read operations and the write operations vary between clock cycles.

In an embodiment, the memory instances are organized into at least a first grid of the horizontal logical banks and the vertical logical banks, the method further comprising concurrently scheduling read operations on multiple horizontal logical banks in the first grid along with a read operation or write operation on a first vertical bank in the first grid that shares a memory instance with each of the multiple horizontal logical banks.

6.0. Implementation Mechanism—Hardware Overview

According to one embodiment, the techniques described herein are implemented by one or more special-purpose computing devices. The special-purpose computing devices may be desktop computer systems, portable computer systems, handheld devices, networking devices, or any other device that incorporates hard-wired and/or program logic to implement the techniques. The special-purpose computing devices may be hard-wired to perform the techniques, or may include digital electronic devices such as one or more application-specific integrated circuits (ASICs) or field programmable gate arrays (FPGAs) that are persistently programmed to perform the techniques. Such special-purpose computing devices may also combine custom hard-wired logic, ASICs, FPGAs, or other circuitry with custom programming to accomplish the techniques.

Though certain foregoing techniques are described with respect to a hardware implementation, which provides a number of advantages in certain embodiments, it will also be recognized that, in other embodiments, the foregoing techniques may still provide certain advantages when performed partially or wholly in software. Accordingly, in such an embodiment, a suitable implementing apparatus comprises a general-purpose hardware processor and is configured to perform any of the foregoing methods by executing program instructions in firmware, memory, other storage, or a combination thereof.

Figure 13:
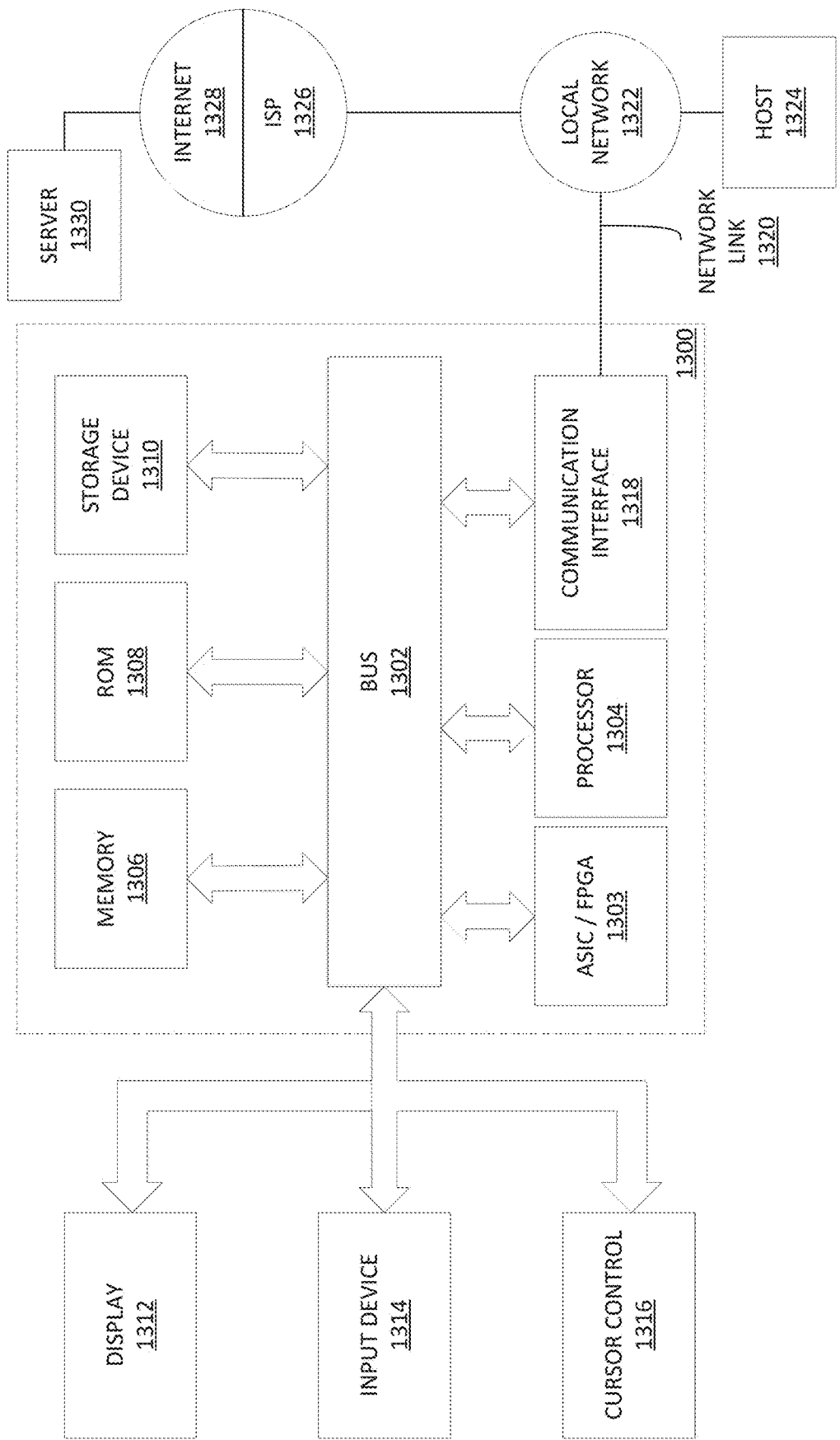
FIG. 13 is block diagram of an example computer system upon which embodiments of the inventive subject matter may be implemented.

FIG. 13 is a block diagram that illustrates an example computer system 1300 that may be utilized in implementing the above-described techniques, according to an embodiment. Computer system 1300 may be, for example, a desktop computing device, laptop computing device, tablet, smartphone, server appliance, computing mainframe, multimedia device, handheld device, networking apparatus, or any other suitable device. In an embodiment, FIG. 13 constitutes a different view of the devices and systems described in previous sections.

Computer system 1300 may include one or more ASICs, FPGAs, or other specialized circuitry 1303 for implementing program logic as described herein. For example, circuitry 1303 may include fixed and/or configurable hardware logic blocks for implementing some or all of the described techniques, input/output (I/O) blocks, hardware registers or other embedded memory resources such as random-access memory (RAM) for storing various data, and so forth. The logic blocks may include, for example, arrangements of logic gates, flip-flops, multiplexers, and so forth, configured to generate an output signals based on logic operations performed on input signals.

Additionally, and/or instead, computer system 1300 may include one or more hardware processors 1304 configured to execute software-based instructions. Computer system 1300 may also include one or more busses 1302 or other communication mechanism for communicating information. Busses 1302 may include various internal and/or external components, including, without limitation, internal processor or memory busses, a Serial ATA bus, a PCI Express bus, a Universal Serial Bus, a HyperTransport bus, an Infiniband bus, and/or any other suitable wired or wireless communication channel.

Computer system 1300 also includes one or more memories 1306, such as a RAM, hardware registers, or other dynamic or volatile storage device for storing data units to be processed by the one or more ASICs, FPGAs, or other specialized circuitry 1303. Memory 1306 may also or instead be used for storing information and instructions to be executed by processor 1304. Memory 1306 may be directly connected or embedded within circuitry 1303 or a processor 1304. Or, memory 1306 may be coupled to and accessed via bus 1302. Memory 1306 also may be used for storing temporary variables, data units describing rules or policies, or other intermediate information during execution of program logic or instructions.

Computer system 1300 further includes one or more read only memories (ROM) 1308 or other static storage devices coupled to bus 1302 for storing static information and instructions for processor 1304. One or more storage devices 1310, such as a solid-state drive (SSD), magnetic disk, optical disk, or other suitable non-volatile storage device, may optionally be provided and coupled to bus 1302 for storing information and instructions.

A computer system 1300 may also include, in an embodiment, one or more communication interfaces 1318 coupled to bus 1302. A communication interface 1318 provides a data communication coupling, typically two-way, to a network link 1320 that is connected to a local network 1322. For example, a communication interface 1318 may be an integrated services digital network (ISDN) card, cable modem, satellite modem, or a modem to provide a data communication connection to a corresponding type of telephone line. As another example, the one or more communication interfaces 1318 may include a local area network (LAN) card to provide a data communication connection to a compatible LAN. As yet another example, the one or more communication interfaces 1318 may include a wireless network interface controller, such as an 802.11-based controller, Bluetooth controller, Long Term Evolution (LTE) modem, and/or other types of wireless interfaces. In any such implementation, communication interface 1318 sends and receives electrical, electromagnetic, or optical signals that carry digital data streams representing various types of information.

Network link 1320 typically provides data communication through one or more networks to other data devices. For example, network link 1320 may provide a connection through local network 1322 to a host computer 1324 or to data equipment operated by a Service Provider 1326. Service Provider 1326, which may for example be an Internet Service Provider (ISP), in turn provides data communication services through a wide area network, such as the worldwide packet data communication network now commonly referred to as the "Internet" 1328. Local network 1322 and Internet 1328 both use electrical, electromagnetic or optical signals that carry digital data streams. The signals through the various networks and the signals on network link 1320 and through communication interface 1318, which carry the digital data to and from computer system 1300, are example forms of transmission media.

In an embodiment, computer system 1300 can send and receive data units through the network(s), network link 1320, and communication interface 1318. In some embodiments, this data may be data units that the computer system 1300 has been asked to process and, if necessary, redirect to other computer systems via a suitable network link 1320. In other embodiments, this data may be instructions for implementing various processes related to the described techniques. For instance, in the Internet example, a server 1330 might transmit a requested code for an application program through Internet 1328, ISP 1326, local network 1322 and communication interface 1318. The received code may be executed by processor 1304 as it is received, and/or stored in storage device 1310, or other non-volatile storage for later execution. As another example, information received via a network link 1320 may be interpreted and/or processed by a software component of the computer system 1300, such as a web browser, application, or server, which in turn issues instructions based thereon to a processor 1304, possibly via an operating system and/or other intermediate layers of software components.

Computer system 1300 may optionally be coupled via bus 1302 to one or more displays 1312 for presenting information to a computer user. For instance, computer system 1300 may be connected via a High-Definition Multimedia Interface (HDMI) cable or other suitable cabling to a Liquid Crystal Display (LCD) monitor, and/or via a wireless connection such as peer-to-peer Wi-Fi Direct connection to a Light-Emitting Diode (LED) television. Other examples of suitable types of displays 1312 may include, without limitation, plasma display devices, projectors, cathode ray tube (CRT) monitors, electronic paper, virtual reality headsets, braille terminal, and/or any other suitable device for outputting information to a computer user. In an embodiment, any suitable type of output device, such as, for instance, an audio speaker or printer, may be utilized instead of a display 1312.

One or more input devices 1314 are optionally coupled to bus 1302 for communicating information and command selections to processor 1304. One example of an input device 1314 is a keyboard, including alphanumeric and other keys. Another type of user input device 1314 is cursor control 1316, such as a mouse, a trackball, or cursor direction keys for communicating direction information and command selections to processor 1304 and for controlling cursor movement on display 1312. This input device typically has two degrees of freedom in two axes, a first axis (e.g., x) and a second axis (e.g., y), that allows the device to specify positions in a plane. Yet other examples of suitable input devices 1314 include a touch-screen panel affixed to a display 1312, cameras, microphones, accelerometers, motion detectors, and/or other sensors. In an embodiment, a network-based input device 1314 may be utilized. In such an embodiment, user input and/or other information or commands may be relayed via routers and/or switches on a Local Area Network (LAN) or other suitable shared network, or via a peer-to-peer network, from the input device 1314 to a network link 1320 on the computer system 1300.

As discussed, computer system 1300 may implement techniques described herein using customized hard-wired logic, one or more ASICs or FPGAs 1303, firmware and/or program logic, which in combination with the computer system causes or programs computer system 1300 to be a special-purpose machine. According to one embodiment, however, the techniques herein are performed by computer system 1300 in response to processor 1304 executing one or more sequences of one or more instructions contained in main memory 1306. Such instructions may be read into main memory 1306 from another storage medium, such as storage device 1310. Execution of the sequences of instructions contained in main memory 1306 causes processor 1304 to perform the process steps described herein.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1310. Volatile media includes dynamic memory, such as main memory 1306. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1302. Transmission media can also take the form of acoustic or light waves, such as those generated during radio-wave and infra-red data communications.

Various forms of media may be involved in carrying one or more sequences of one or more instructions to processor 1304 for execution. For example, the instructions may initially be carried on a magnetic disk or solid-state drive of a remote computer. The remote computer can load the instructions into its dynamic memory and use a modem to send the instructions over a network, such as a cable network or cellular network, as modulated signals. A modem local to computer system 1300 can receive the data on the network and demodulate the signal to decode the transmitted instructions. Appropriate circuitry can then place the data on bus 1302. Bus 1302 carries the data to main memory 1306, from which processor 1304 retrieves and executes the instructions. The instructions received by main memory 1306 may optionally be stored on storage device 1310 either before or after execution by processor 1304.

7.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the inventive subject matter have been described with reference to numerous specific details that may vary from implementation to implementation. Thus, the sole and exclusive indicator of what is the inventive subject matter, and is intended by the applicants to be the inventive subject matter, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A network switching apparatus comprising:
a plurality of memory instances that form a buffer, each of the memory instances comprising a plurality of entries configured to store storage data units ('SDU"), each of the entries configured to store a single SDU, the memory instances organized into overlapping logical banks, including horizontal logical banks and vertical logical banks;
write logic configured to write transport data units ("TDUs") to the logical banks by, for each TDU of the TDUs, writing one or more SDUs into which the TDU has been divided to different entries in different memory instances of a logical bank assigned to the TDU, and, when the logical bank is one of the horizontal logical banks, calculating a parity SDU and writing the parity SDU to the logical bank;
read logic configured to output the TDUs from the logical banks by, for each TDU of the TDUs, reading one or more of the SDUs into which the TDU was divided from the different memory instances of the logical bank to which the TDU was written, and, when the logical bank is a horizontal logical bank that shares a same memory instance with a vertical logical bank that is being read concurrently, instead of reading a particular SDU from the shared memory instance, reconstructing the particular SDU using a particular parity SDU that was written for the TDU in another memory instance of the horizontal logical bank.

2. The apparatus of claim 1, further comprising:
buffer logic configured to receive write requests to write transport data units ("TDUs") to the buffer and to receive read requests to read the TDUs from the buffer;
scheduling logic configured to schedule the write requests and the read requests for execution in particular clock cycles, the scheduling logic configured to schedule a first operation that accesses a particular horizontal logical bank concurrently, in a same clock cycle, with a second operation that accesses a particular vertical logical bank that shares a particular memory instance with the particular horizontal logical bank.

3. The apparatus of claim 1:
wherein the write logic is configured to generate the parity SDU for a first TDU that has been divided into first SDUs using an exclusive-or ("XOR") operation between each of the first SDUs;
wherein the read logic is configured to reconstruct the particular SDU for the first TDU using an exclusive-or ("XOR") operation between each other of the first SDUs and the parity SDU.

4. The apparatus of claim 1, wherein the horizontal logical banks and the vertical logical banks are organized into a grid, each of the horizontal logical banks sharing a memory instance with each of the vertical logical banks.

5. The apparatus of claim 1, wherein each of the memory instances is a single-ported memory instance that is accessible only once per clock cycle.

6. The apparatus of claim 1,
wherein the memory instances are further organized into diagonal logical banks;
wherein the write logic is configured to, for each TDU of the TDUs, calculate the parity SDU and write the parity SDU to the logical bank regardless of the logical bank to which the TDU is written;
wherein, when concurrently reading from any two logical banks that share a same memory instance, the read logic is configured not to read a first SDU from the shared memory instance for a first TDU that was written to a particular one of the logical banks, and to instead reconstruct the first SDU using a first parity SDU that was written for the first TDU in another memory instance of the particular one of the logical banks.

7. The apparatus of claim 1, further comprising:
scheduling logic configured to schedule the write requests and the read requests for execution in particular clock cycles;
wherein the memory instances are organized into at least three separate grids of the horizontal logical banks and the vertical logical banks;
wherein the scheduling logic is configured to, for a given clock, select a first grid for executing read operations, select a second grid for executing write operations on horizontal logical banks in the second grid, and select a third grid for executing write operations on vertical logical banks in the third grid, wherein the grids selected for the read operations and the write operations vary between clock cycles.

8. The apparatus of claim 1, further comprising:
scheduling logic configured to schedule the write requests and the read requests for execution in particular clock cycles;
wherein the memory instances are organized into at least a first grid of the horizontal logical banks and the vertical logical banks;
wherein the scheduling logic is configured to concurrently schedule read operations on multiple horizontal logical banks in the first grid along with a read operation or write operation on a first vertical bank in the first grid that shares a memory instance with each of the multiple horizontal logical banks.

9. A method comprising:
utilizing a plurality of memory instances as a buffer, each of the memory instances comprising a plurality of entries configured to store storage data units ('SDU"), each of the entries configured to store a single SDU, the memory instances organized into overlapping logical banks, including horizontal logical banks and vertical logical banks;
writing transport data units ("TDUs") to the logical banks by, for each TDU of the TDUs:
  writing one or more SDUs into which the TDU has been divided to different entries in different memory instances of a logical bank assigned to the TDU; and
  when the logical bank is one of the horizontal logical banks, calculating a parity SDU and writing the parity SDU to the logical bank; and
outputting the TDUs from the logical banks by, for each TDU of the TDUs:
  reading one or more of the SDUs into which the TDU was divided from the different memory instances of the logical bank to which the TDU was written; and
  when the logical bank is a horizontal logical bank that shares a same memory instance with a vertical logical bank that is being read concurrently, instead of reading a particular SDU from the shared memory instance, reconstructing the particular SDU using a particular parity SDU that was written for the TDU in another memory instance of the horizontal logical bank.

10. The method of claim 9, further comprising:
receiving write requests to write transport data units ("TDUs") to the buffer and to receive read requests to read the TDUs from the buffer;
scheduling the write requests and the read requests for execution in particular clock cycles, including scheduling a first operation that accesses a particular horizontal logical bank concurrently, in a same clock cycle, with a second operation that accesses a particular vertical logical bank that shares a particular memory instance with the particular horizontal logical bank;
wherein each of the memory instances is a single-ported memory instance that is accessible only once per clock cycle.

11. The method of claim 9, further comprising:
generating the parity SDU for a first TDU that has been divided into first SDUs using an exclusive-or ("XOR") operation between each of the first SDUs;
reconstructing the particular SDU for the first TDU using an exclusive-or ("XOR") operation between each other of the first SDUs and the parity SDU.

12. The method of claim 9, wherein the horizontal logical banks and the vertical logical banks are organized into a grid, each of the horizontal logical banks sharing a memory instance with each of the vertical logical banks.

13. The method of claim 9, further comprising:
wherein the memory instances are further organized into diagonal logical banks;
for each TDU of the TDUs, calculating the parity SDU and writing the parity SDU to the logical bank regardless of the logical bank to which the TDU is written;
when concurrently reading from any two logical banks that share a same memory instance, instead of reading a first SDU from the shared memory instance for a first TDU that was written to a particular one of the logical banks, and reconstructing the first SDU using a first parity SDU that was written for the first TDU in another memory instance of the particular one of the logical banks.

14. The method of claim 9, further comprising:
scheduling the write requests and the read requests for execution in particular clock cycles;
wherein the memory instances are organized into at least three separate grids of the horizontal logical banks and the vertical logical banks;
for a given clock, selecting a first grid for executing read operations, selecting a second grid for executing write operations on horizontal logical banks in the second grid, and selecting a third grid for executing write operations on vertical logical banks in the third grid, wherein the grids selected for the read operations and the write operations vary between clock cycles.

15. The method of claim 9, further comprising:
scheduling the write requests and the read requests for execution in particular clock cycles;
wherein the memory instances are organized into at least a first grid of the horizontal logical banks and the vertical logical banks;
concurrently scheduling read operations on multiple horizontal logical banks in the first grid along with a read operation or write operation on a first vertical bank in the first grid that shares a memory instance with each of the multiple horizontal logical banks.

16. One or more non-transitory computer-readable media storing instructions that, when executed by one or more computing devices, cause performance of:
utilizing a plurality of memory instances as a buffer, each of the memory instances comprising a plurality of entries configured to store storage data units ('SDU"), each of the entries configured to store a single SDU, the memory instances organized into overlapping logical banks, including horizontal logical banks and vertical logical banks;
writing transport data units ("TDUs") to the logical banks by, for each TDU of the TDUs:
  writing one or more SDUs into which the TDU has been divided to different entries in different memory instances of a logical bank assigned to the TDU; and
  when the logical bank is one of the horizontal logical banks, calculating a parity SDU and writing the parity SDU to the logical bank; and
outputting the TDUs from the logical banks by, for each TDU of the TDUs:
  reading one or more of the SDUs into which the TDU was divided from the different memory instances of the logical bank to which the TDU was written; and
  when the logical bank is a horizontal logical bank that shares a same memory instance with a vertical logical bank that is being read concurrently, instead of reading a particular SDU from the shared memory instance, reconstructing the particular SDU using a particular parity SDU that was written for the TDU in another memory instance of the horizontal logical bank.

17. The one or more non-transitory computer-readable media of claim 16, wherein the instructions, when executed by the one or more computing devices, further cause performance of:
receiving write requests to write transport data units ("TDUs") to the buffer and to receive read requests to read the TDUs from the buffer;
scheduling the write requests and the read requests for execution in particular clock cycles, including scheduling a first operation that accesses a particular horizontal logical bank concurrently, in a same clock cycle, with a second operation that accesses a particular vertical logical bank that shares a particular memory instance with the particular horizontal logical bank;

wherein the horizontal logical banks and the vertical logical banks are organized into a grid, each of the horizontal logical banks sharing a memory instance with each of the vertical logical banks;

wherein each of the memory instances is a single-ported memory instance that is accessible only once per clock cycle.

18. The one or more non-transitory computer-readable media of claim 16, wherein the instructions, when executed by the one or more computing devices, further cause performance of:

generating the parity SDU for a first TDU that has been divided into first SDUs using an exclusive-or ("XOR") operation between each of the first SDUs;

reconstructing the particular SDU for the first TDU using an exclusive-or ("XOR") operation between each other of the first SDUs and the parity SDU.

19. The one or more non-transitory computer-readable media of claim 16, wherein the instructions, when executed by the one or more computing devices, further cause performance of:

scheduling the write requests and the read requests for execution in particular clock cycles;

wherein the memory instances are organized into at least three separate grids of the horizontal logical banks and the vertical logical banks;

for a given clock, selecting a first grid for executing read operations, selecting a second grid for executing write operations on horizontal logical banks in the second grid, and selecting a third grid for executing write operations on vertical logical banks in the third grid, wherein the grids selected for the read operations and the write operations vary between clock cycles.

20. The one or more non-transitory computer-readable media of claim 16, wherein the instructions, when executed by the one or more computing devices, further cause performance of:

scheduling the write requests and the read requests for execution in particular clock cycles;

wherein the memory instances are organized into at least a first grid of the horizontal logical banks and the vertical logical banks;

concurrently scheduling read operations on multiple horizontal logical banks in the first grid along with a read operation or write operation on a first vertical bank in the first grid that shares a memory instance with each of the multiple horizontal logical banks.

* * * * *